(12) United States Patent
Far

(10) Patent No.: US 11,610,104 B1
(45) Date of Patent: Mar. 21, 2023

(54) ASYNCHRONOUS ANALOG ACCELERATOR FOR FULLY CONNECTED ARTIFICIAL NEURAL NETWORKS

(71) Applicant: Ali Tasdighi Far, San Jose, CA (US)

(72) Inventor: Ali Tasdighi Far, San Jose, CA (US)

(*) Notice: Subject to any disclaimer, the term of this patent is extended or adjusted under 35 U.S.C. 154(b) by 0 days.

(21) Appl. No.: 17/408,790

(22) Filed: Aug. 23, 2021

Related U.S. Application Data

(63) Continuation-in-part of application No. 16/997,229, filed on Aug. 19, 2020, now Pat. No. 11,144,316, and
(Continued)

(51) Int. Cl.
  *G06N 3/06* (2006.01)
  *G06N 3/063* (2023.01)
  (Continued)

(52) U.S. Cl.
  CPC ........... *G06N 3/063* (2013.01); *G06F 7/5443* (2013.01); *G06N 3/04* (2013.01)

(58) Field of Classification Search
  CPC ......... G06F 7/5443; G06N 3/063; G06N 3/04
  (Continued)

(56) References Cited

U.S. PATENT DOCUMENTS 3,610,906 A   10/1971   Stampler
4,677,369 A   6/1987    Bowers et al.
(Continued)

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.
(Continued)

*Primary Examiner* — Kevin M Burd

(57) ABSTRACT

Methods of performing mixed-signal/analog multiply-accumulate (MAC) operations used for matrix multiplication in fully connected artificial neural networks in integrated circuits (IC) are described in this disclosure having traits such as: (1) inherently fast and efficient for approximate computing due to current-mode signal processing where summation is performed by simply coupling wires, (2) free from noisy and power hungry clocks with asynchronous fully-connected operations, (3) saving on silicon area and power consumption for requiring neither any data-converters nor any memory for intermediate activation signals, (4) reduced dynamic power consumption due to Compute-In-Memory operations, (5) avoiding over-flow conditions along key signals paths and lowering power consumption by training MACs in neural networks in such a manner that the population and or combinations of multi-quadrant activation signals and multi-quadrant weight signals follow a programmable statistical distribution profile, (6) programmable current consumption versus degree of precision/approximate computing, (7) suitable for 'always-on' operations and capable of 'self power-off', (8) inherently simple arrangement for non-linear activation operations such as Rectified Linear Unit, ReLu, and (9) manufacturable on main-stream, low cost, and lagging edge standard digital CMOS process requiring neither any resistors nor any capacitors.

19 Claims, 8 Drawing Sheets

Related U.S. Application Data a continuation-in-part of application No. 16/730,446, filed on Dec. 30, 2019, and a continuation-in-part of application No. 16/730,539, filed on Dec. 30, 2019, now Pat. No. 11,275,909.

(51) Int. Cl.
*G06F 7/544* (2006.01)
*G06N 3/04* (2023.01)

(58) Field of Classification Search
USPC .......................................................... 341/126
See application file for complete search history.

(56) References Cited

U.S. PATENT DOCUMENTS

| | | |
|---|---|---|
| 4,817,028 A | 3/1989 | Masson et al. |
| 4,827,260 A | 5/1989 | Sugawa et al. |
| 4,899,066 A | 2/1990 | Aikawa et al. |
| 5,218,246 A | 6/1993 | Lee et al. |
| 5,261,035 A | 11/1993 | Adler |
| 5,280,564 A | 1/1994 | Shioni et al. |
| 5,283,579 A | 2/1994 | Tasdighi |
| 5,289,055 A | 2/1994 | Razavi |
| 5,294,927 A | 3/1994 | Levinson et al. |
| 5,329,632 A | 7/1994 | Lee et al. |
| 5,334,888 A | 8/1994 | Bodas |
| 5,337,267 A | 8/1994 | Colavin |
| 5,391,938 A | 2/1995 | Hatsuda |
| 5,495,245 A | 2/1996 | Ashe |
| 5,523,707 A | 6/1996 | Levy et al. |
| 5,535,309 A | 7/1996 | Shin |
| 5,576,637 A | 11/1996 | Akaogi et al. |
| 5,581,661 A | 12/1996 | Wang |
| 5,583,456 A | 12/1996 | Kimura |
| 5,592,107 A | 1/1997 | McDermott |
| 5,619,444 A | 4/1997 | Agranat et al. |
| 5,629,885 A | 5/1997 | Pirson et al. |
| 5,640,084 A | 6/1997 | Tero et al. |
| 5,668,710 A | 9/1997 | Caliboso et al. |
| 5,703,588 A | 12/1997 | Rivoir et al. |
| 5,734,260 A | 3/1998 | Tasdighi et al. |
| 5,734,291 A | 3/1998 | Tasdighi et al. |
| 5,760,726 A | 6/1998 | Koifman et al. |
| 5,801,655 A | 9/1998 | Imamura |
| 5,814,995 A | 9/1998 | Tasdighi |
| 5,831,566 A | 11/1998 | Ginetti |
| 5,861,762 A | 1/1999 | Sutherland |
| 5,870,049 A | 2/1999 | Huang et al. |
| 5,923,208 A | 7/1999 | Tasdighi et al. |
| 5,966,029 A | 10/1999 | Tarrab et al. |
| 5,969,658 A | 10/1999 | Naylor |
| 6,002,354 A | 12/1999 | Itoh et al. |
| 6,005,374 A | 12/1999 | Tasdighi |
| 6,018,758 A | 1/2000 | Griesbach |
| 6,032,169 A | 2/2000 | Malzahn |
| 6,052,074 A | 4/2000 | Iida |
| 6,054,823 A | 4/2000 | Collings et al. |
| 6,072,415 A | 6/2000 | Cheng |
| 6,122,284 A | 9/2000 | Tasdighi et al. |
| 6,163,288 A | 12/2000 | Yoshizawa |
| 6,225,929 B1 | 5/2001 | Beck |
| 6,243,033 B1 | 6/2001 | Mizuno |
| 6,260,056 B1 | 7/2001 | Dalal |
| 6,298,368 B1 | 10/2001 | Miller, Jr. |
| 6,301,598 B1 | 10/2001 | Dierke et al. |
| 6,329,941 B1 | 12/2001 | Farooqi |
| 6,384,763 B1 | 5/2002 | Leung et al. |
| 6,392,574 B1 | 5/2002 | Toosky |
| 6,393,453 B1 | 5/2002 | Purcell |
| 6,424,283 B2 | 7/2002 | Bugeja et al. |
| 6,448,917 B1 | 9/2002 | Leung et al. |
| 6,463,452 B1 | 10/2002 | Schulist |
| 6,489,905 B1 | 12/2002 | Lee et al. |
| 6,507,304 B1 | 1/2003 | Lorenz |
| 6,542,098 B1 | 4/2003 | Casper et al. |
| 6,573,758 B2 | 6/2003 | Boerstler et al. |
| 6,583,744 B2 | 6/2003 | Bright |
| 6,727,728 B1 | 4/2004 | Bitting |
| 6,754,645 B2 | 6/2004 | Shi et al. |
| 6,903,579 B2 | 6/2005 | Rylov |
| 6,930,512 B2 | 8/2005 | Yin |
| 6,967,609 B1 | 11/2005 | Bicakei et al. |
| 7,003,544 B1 | 2/2006 | Langhammer |
| 7,088,138 B2 | 8/2006 | Xu et al. |
| 7,136,002 B2 | 11/2006 | Dempsey et al. |
| 7,142,014 B1 | 11/2006 | Groen et al. |
| 7,298,171 B2 | 11/2007 | Parris |
| 7,312,740 B2 | 12/2007 | Chou |
| 7,557,614 B1 | 7/2009 | Bonsels et al. |
| 7,612,583 B2 | 11/2009 | Winograd |
| 7,903,016 B1 | 3/2011 | Wyatt |
| 8,416,112 B2 | 4/2013 | Aude et al. |
| 8,558,727 B2 | 10/2013 | McGowan |
| 8,653,857 B2 | 2/2014 | Becker |
| 8,981,981 B1 | 3/2015 | Mossawir |
| 9,069,995 B1 | 6/2015 | Cronie |
| 9,384,168 B2 | 7/2016 | Mortensen |
| 9,519,304 B1 | 12/2016 | Far |
| 9,780,652 B1 | 10/2017 | Far |
| 9,921,600 B1 | 3/2018 | Far |
| 10,177,713 B1 | 1/2019 | Far |
| 10,198,022 B1 | 2/2019 | Far |
| 10,311,342 B1 | 6/2019 | Farhadi et al. |
| 10,387,740 B2 | 8/2019 | Yang et al. |
| 10,411,597 B1 | 9/2019 | Far |
| 10,491,167 B1 | 11/2019 | Far |
| 10,504,022 B2 | 12/2019 | Temam et al. |
| 10,536,117 B1 | 1/2020 | Far |
| 10,560,058 B1 | 2/2020 | Far |
| 10,581,448 B1 | 3/2020 | Far |
| 10,592,208 B2 | 3/2020 | Wang et al. |
| 10,594,334 B1 | 3/2020 | Far |
| 10,664,438 B2 | 3/2020 | Sity et al. |
| 10,621,486 B2 | 4/2020 | Yao |
| 10,684,955 B2 | 6/2020 | Luo et al. |
| 10,691,975 B2 | 6/2020 | Bagherinezhad et al. |
| 10,699,182 B2 | 6/2020 | Gulland et al. |
| 10,700,695 B1 | 6/2020 | Far |
| 10,789,046 B1 | 9/2020 | Far |
| 10,797,718 B1 | 10/2020 | Far |
| 10,804,921 B1 | 10/2020 | Far |
| 10,804,925 B1 | 10/2020 | Far |
| 10,819,283 B1 | 10/2020 | Far |
| 10,826,525 B1 | 11/2020 | Far |
| 10,832,014 B1 | 11/2020 | Far |
| 10,833,692 B1 | 11/2020 | Far |
| 10,848,167 B1 | 11/2020 | Far |
| 10,862,495 B1 | 12/2020 | Far |
| 10,862,501 B1 | 12/2020 | Far |
| 10,884,705 B1 | 1/2021 | Far |
| 10,915,298 B1 | 2/2021 | Far |
| 11,016,732 B1 | 5/2021 | Far |
| 2001/0026236 A1 | 10/2001 | Toda |
| 2001/0056455 A1 | 12/2001 | Lin |
| 2003/0225716 A1 | 12/2003 | Shi et al. |
| 2004/0181566 A1 | 9/2004 | Ettorre et al. |
| 2004/0183706 A1 | 9/2004 | Brauns et al. |
| 2005/0125477 A1 | 6/2005 | Genov et al. |
| 2005/0218984 A1 | 10/2005 | Yin |
| 2007/0086655 A1 | 4/2007 | Simard et al. |
| 2009/0045993 A1 | 2/2009 | Tokumaru et al. |
| 2009/0184855 A1 | 7/2009 | Tokumaru et al. |
| 2010/0072821 A1 | 3/2010 | Ramaguchi et al. |
| 2010/0283642 A1 | 11/2010 | Lai et al. |
| 2012/0126852 A1 | 5/2012 | Shin et al. |
| 2015/0091784 A1 | 4/2015 | Kwon et al. |
| 2016/0026912 A1 | 1/2016 | Falcon et al. |
| 2016/0239706 A1 | 8/2016 | Franciscus et al. |
| 2016/0246506 A1 | 8/2016 | Hebig et al. |
| 2016/0328647 A1 | 11/2016 | Lin et al. |
| 2017/0200094 A1 | 7/2017 | Bruestle et al. |
| 2019/0286953 A1 | 9/2019 | Farhadi et al. |
| 2019/0325269 A1 | 10/2019 | Bagherinezhad et al. |

(56) References Cited

U.S. PATENT DOCUMENTS

| | | | |
|---|---|---|---|
| 2020/0184037 A1 | 6/2020 | Zatloukal et al. | |
| 2020/0184044 A1 | 6/2020 | Zatloukal | |
| 2020/0272795 A1* | 8/2020 | Kenney | G06J 1/02 |
| 2021/0004668 A1* | 1/2021 | Moshovos | G06N 3/0454 |
| 2021/0312270 A1* | 10/2021 | Liguori | G06F 7/5443 |

OTHER PUBLICATIONS

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5 µW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE—Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2 µW half bandgap reference in standard sub-µ CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn Meeting on Power, Electronics and Computing (ROPEC), Ixtapa, 2014, pp. 1-5.

Qing Dong et al., "A 0.3V VDDmin 4+2T SRAM for searching and in-memory computing using 55nm DDC technology," 2017 Symposium on VLSI Circuits, Kyoto, 2017, pp. C160-C161, doi: 10.23919/VLSIC.2017.8008465.

Yen-Cheng Chiu et al., "A 4-Kb 1-to-8-bit Configurable 6T SRAM-Based Computation-in-Memory Unit-Macro for CNN-Based AI Edge Processors," in IEEE Journal of Solid-State Circuits, doi: 10.1109/JSSC.2020.3005754.

Jingcheng Wang et al., "A 28-nm Compute SRAM With Bit-Serial Logic/Arithmetic Operations for Programmable In-Memory Vector Computing," in IEEE Journal of Solid-State Circuits, vol. 55, No. 1, pp. 76-86, Jan. 2020, doi: 10.1109/JSSC.2019.2939682.

Daniel Bankman et al., "An Always-On 3.8 \$\mu\$ J/86% CIFAR-10 Mixed-Signal Binary CNN Processor With All Memory on Chip in 28-nm CMOS," in IEEE Journal of Solid-State Circuits, vol. 54, No. 1, pp. 158-172, Jan. 2019, doi: 10.1109/JSSC.2018.2869150.

Gobinda Saha et al "An Energy-Efficient and High Throughput in-Memory Computing Bit-Cell With Excellent Robustness Under Process Variations for Binary Neural Network," in IEEE Access, vol. 8, pp. 91405-91414, 2020, doi: 10.1109/ACCESS.2020.2993989.

Han-Chun Chen et al., "Configurable 8T SRAM for Enbling in-Memory Computing," 2019 2nd International Conference on Communication Engineering and Technology (ICCET), Nagoya, Japan, 2019, pp. 139-142, doi: 10.1109/ICCET.2019.8726871.

James Clay et al., "Energy-efficient and reliable in-memory classifier for machine-learning applications," in IET Computers & Digital Techniques, vol. 13, No. 6, pp. 443-452, Nov. 2019, doi: 10.1049/iet-cdt.2019.0040.

Naveen Verma et al., "In-Memory Computing: Advances and Prospects," in IEEE Solid-State Circuits Magazine, vol. 11, No. 3, pp. 43-55, Summer 2019, doi: 10.1109/MSSC.2019.2922889.

Yu Wang, "Neural Networks on Chip: From CMOS Accelerators to In-Memory-Computing," 2018 31st IEEE International System-on-Chip Conference (SOCC), Arlington, VA, 2018, pp. 1-3, doi: 10.1109/SOCC.2018.8618496.

Hossein Valavi et al., "A Mixed-Signal Binarized Convolutional-Neural-Network Accelerator Integrating Dense Weight Storage and Multiplication for Reduced Data Movement," 2018 IEEE Symposium on VLSI Circuits, Honolulu, HI, 2018, pp. 141-142, doi: 10.1109/VLSIC.2018.8502421.

Hossein Valavi et al., "A 64-Tile 2.4-Mb In-Memory-Computing CNN Accelerator Employing Charge-Domain Compute," in IEEE Journal of Solid-State Circuits, vol. 54, No. 6, pp. 1789-1799, Jun. 2019, doi: 10.1109/JSSC.2019.2899730.

Yinqi Tang et al., "Scaling Up In-Memory-Computing Classifiers via Boosted Feature Subsets in Banked Architectures," in IEEE Transactions on Circuits and Systems II: Express Briefs, vol. 66, No. 3, pp. 477-481, Mar. 2019, doi: 10.1109/TCSII.2018.2854759.

Jinato Zhang et al. "A machine-learning classifier implemented in a standard 6T SRAM array," 2016 IEEE Symposium on VLSI Circuits (VLSI—Circuits), Honolulu, HI, 2016, pp. 1-2, doi: 10.1109/VLSIC.2016.7573556.

Jinato Zhang et al. "An In-memory-Computing DNN Achieving 700 TOPS/W and 6 TOPS/mm2 in 130-nm CMOS," in IEEE Journal on Emerging and Selected Topics in Circuits and Systems, vol. 9, No. 2, pp. 358-366, Jun. 2019, doi: 10.1109/JETCAS.2019.2912352.

Akhilesh Jaiswal et al.,"8T SRAM Cell as a Multibit Dot-Product Engine for Beyond Von Neumann Computing," in IEEE Transactions on Very Large Scale Integration (VLSI) Systems, vol. 27, No. 11, pp. 2556-2567, Nov. 2019, doi: 10.1109/TVLSI.2019.2929245.

Jinsu Lee et al., "A 17.5-fJ/bit Energy-Efficient Analog SRAM for Mixed-Signal Processing," in IEEE Transactions on Very Large Scale Integration (VLSI) Systems, vol. 25, No. 10, pp. 2714-2723, Oct. 2017, doi: 10.1109/TVLSI.2017.2664069.

Qing Dong et al., "15.3 A 351TOPS/W and 372.4GOPS Compute-in-Memory SRAM Macro in 7nm FinFET CMOS for Machine-Learning Applications," 2020 IEEE International Solid-State Circuits Conference—(ISSCC), San Francisco, CA, USA, 2020, pp. 242-244, doi: 10.1109/ISSCC19947.2020.9062985.

\* cited by examiner

ASYNCHRONOUS ANALOG ACCELERATOR FOR FULLY CONNECTED ARTIFICIAL NEURAL NETWORKS

CROSS-REFERENCE TO RELATED PATENT APPLICATIONS

This application is a continuation-in-part of and claims the benefit of priority from U.S. patent application Ser. No. 16/997,229 filed on Aug. 19, 2020. Furthermore, this application is a continuation-in-part of and claims the benefit of priority from U.S. patent application Ser. No. 16/730,446 filed on Dec. 30, 2019. Furthermore, this application is a continuation-in-part of and claims the benefit of priority from U.S. patent application Ser. No. 16/730,539 filed on Dec. 30, 2019.

FIELD OF DISCLOSURE

This disclosure relates to improvements in analog multiply-accumulate (iMAC) integrated circuits (IC) used for matrix multiplications in Deep Neural Networks (DNN), Fully Connected Artificial Neural networks (ANN), Neural Networks composed of series of fully connected layers, and Dense Neural Networks (DNN) that target low-power emerging artificial intelligence and machine learning (AI & ML) applications, including artificially intelligence sensor, edge-computing, and tiny machine learning (TinyML) applications.

BACKGROUND

Digital computation engines provide programmable multiply-accumulate (MAC) functions that generally require advanced and expensive deep sub-micron transistors and bleeding-edge semiconductor manufacturing. Dedicated or general-purpose digital computation and MAC engines are generally flexible and power-full, which makes them suitable for cloud-based computing applications. They can perform large numbers of complex MAC operations in the cloud with flexibility, programmability, precision, and speed. However, bleeding edge digital MAC engines ICs generally consume a lot of power and are expensive. Moreover, digital MAC engines ICs residing on the cloud are potentially less secure (e.g., communications through the cloud which may be hacked and or intercepted). They have latency delays that may be unacceptable for some applications at the edge of a network, such as medical applications in which a person's life may depend on real-time response. Programmability features of conventional digital MAC ICs is important, but as noted, such flexibility comes a cost of higher power consumption, higher cost of IC, longer response time in terms of latency delays, and lesser safety/privacy can make them prohibitive for some applications at the edge, or in sensor applications. Also, keep in mind that the flexibility of conventional digital MAC ICs such as in addressing, reading, and writing into and out of memory, especially during high-speeds computations, may increase MAC IC's power consumption significantly.

For machine learning applications near the edge or sensors, power consumption as well as cost are key metrics. Machine learning ICs near sensors generally have higher volumes and a shorter life cycle, and as such they cannot afford to be expensive, when compared to machine learning ICs that are deployed in cloud data centers which typically have longer life cycles and not as price sensitive.

The real world is analog, and real-world signals are approximate. Most of the real-world signals that are captured by sensors are slow moving and would not require extremely high-speed signal processing. Nor such low-speed real-world signals require ICs based on super high-speed and expensive bleeding edge manufacturing.

Thus, for edge computing and near/on sensor machine learning applications, generally speaking, low cost and low power may be significantly more important metrics than programmability and speed of computation.

Certain quality of service (QoS) requirements for safety and privacy, such as in medical or residential surveillance and appliance applications, may prohibit some sensors and edge devices from delegating their machine learning tasks to the cloud. Imagine a dumb sensor that relies on the cloud for intelligence when a hacker would intercept a sensitive communication link and takes control over the information and data of a heart pacemaker, hearing aid, or residence digital electronics (e.g., smart AC, smart door opener, smart fireplace control, etc.). Imagine sound-spotting (e.g., intruder running, gun-shot) intelligence sensors that must be 'always-on', and powered by a small battery that lasts 30 years while monitoring a warehouse 24×7. Imagine a necklace sensor that is 'always-on' and is powered by a battery that lasts 10 years and it monitors sound of glass breakage, scream, and or accidental fall of an elderly person. Such machine learning computation (on or near sensors) must be performed locally and not in the cloud for ultra-low power consumption, safety, latency, and low-cost requirements, which cannot be satisfied by software programmable general purpose digital computation engine.

Be mindful that in the last four decades we have significant and continued advancements in chip manufacturing and as such we are closer to the end of Moore's Law. This means going forward, the semiconductor industry and ICs cannot bank on chip costs to, for example, depreciate twice every 18-months as it has been doing for the last few decades. In other words, companies may not risk investing today in potential future mass markets by utilizing today's expensive digital machine learning ICs because the cost of today's digital ICs may not decline much from here.

As such, low cost, low current consumption, low voltage, asynchronous operations, safety and privacy are not 'nice-to-having' but 'must-have' traits and key priorities for distributed intelligence, edge-based machine learning, and smart sensors applications. Such traits would enable smart sensing free from the bounds of the cloud (based machine learning), free from the bounds of wire, free from frequent battery recharges, and free from some cloud-based remote intelligence utilizing public networks that may be compromised.

SUMMARY OF THE INVENTION

It is an objective of the present disclosure to provide improvements to ICs utilizing analog current-mode multipliers (iMULT) and analog current-mode multiply-accumulate (iMAC) operations used for matrix multiplications in neural network (NN) and machine learning (ML) on sensors or devices including without limitation the following, in part or in combination thereof:

An objective of this disclosure is to provide MAC ICs operating in current mode where signal swings are small and thus signal processing can be inherently fast.

Another objective of this disclosure is to optimize cost-performance of a MAC IC by arranging the MAC and training the MAC in neural networks in such a manner that the population and or combinations of activation and weight signals follow a programmable statistical distribution profile (e.g., Gaussian distribution with an average and a sigma). Such an objective leads to signal swings that follow a more defined profile in key summation nodes, which would avoid and or control over-flow conditions, reduce power consumption and improves speed attributed to such summation nodes.

Another objective of the present disclosure is to arrange a simple non-linear function (e.g., rectified linear activation function or ReLu) and bias generation circuits in analog to save on silicon die area and improve speed.

Accumulating a plurality of multiplication products in conventional digital MAC ICs could require large size accumulators whose outputs would otherwise overflow as more signals add-up in the accumulator. Generally, outputs of analog MAC ICs can also run out of headroom (considering limited power supplies available voltage) if they are required to accumulate many analog signals. Therefore, an objective of this disclosure is to provide MAC ICs that are less constrained by signal overflow constraints, or power supply headroom limitations.

Another objective of the present disclosure is to arrange MULT and MAC in neural networks that facilitates 'approximate computation' that is asynchronous, consumes low power, and has small size. Moreover, the objective here is to leverage the trade off in analog processing between low power and analog errors in form of accuracy degradation, but not total failures. This trait can provide the AI & ML end-application with approximate results to work with instead of experiencing failed results.

Another objective of this disclosure is to arrange MAC in neural networks in such a manner to perform MAC functions in analog, or mixed-mode, or both, so to avoid intermediate Analog-to-Digital-Converter (ADC) as well as Digital-to-Analog Converter (DAC). Accordingly, memory/register functions that process/store the intermediate or partial digital summations are avoided, with the further objective to save digital memory area and reduce dynamic power consumption associated with read-write cycles into and out of memory.

Another objective of this disclosure is to provide MAC ICs that can be arranged with Compute-in-Memory (CIM) or near-memory-compute (NMC) that enable lower dynamic power consumption resulting from read-write cycles into and out of memory.

Another objective of the present disclosure is to perform 'scalar multiplications' by arranging MULT and MAC in neural networks by combining data-converters with a reference bias network (RBN) that distributes an activation signal (scalar) that is multiplied with a plurality of weights, in order to save on silicon, die area and improves dynamic response and product output matching.

Another objective of the present disclosure is to perform 'scalar multiplications' by arranging MULT and MAC in neural networks that utilize substrate vertical Bipolar-Junction-Transistors (vBJT) that are available parasitically and at no extra cost in digital CMOS manufacturing, wherein an activation signal (scalar) is multiplied with a plurality of weights in an area and power efficient manner. Further objective of the present disclosure is to utilize such vBJT in order to operate an iMULT at high-to-low analog input currents, and to remove the subthreshold (ultra-low current) restriction from the iMULT and iMAC.

Another objective of the present disclosure is to perform 'scalar multiplications' by arranging iMULT and iMAC in neural networks that utilize MOSFETs that operate in subthreshold wherein an activation signal (scalar) is multiplied with a plurality of weights, in an area and power efficient manner.

Another objective of the present disclosure is to arrange iMULT and iMAC in neural networks wherein functions such as addition or subtraction can occupy small areas (e.g., addition of two current signals requires the coupling of two wires) and be inherently fast.

An objective of the present disclosure is to arrange MULT and MAC in neural networks that are small and low cost. Small size and low cost are especially important in AI & ML applications that may require a plurality of multipliers and multiply-accumulate functions on the same IC.

Another objective of the present disclosure is to arrange MULT and MAC in neural networks that have low current consumption. As stated earlier, low current consumption is critical in AI & ML applications that may require numerous (sea-of) multiply-accumulate functions on a chip near or at sensors that run on tiny batteries.

Another objective of the present disclosure is to enable "always-on" operation wherein for a meaningful portion of the computation circuitry to shut itself off (i.e., 'smart self-power-down') in the face of no incoming signal so that the computation circuits can remain 'always on' (providing on-going intelligent sensing without power-down disruptions) while consuming very low stand-by current.

Another objective of the present disclosure is to arrange MULT and MAC in neural networks that can be operate with low $V_{SS}$ and $V_{DD}$ which helps lowering the power consumption further.

Another objective of the present disclosure is to arrange iMULT and iMAC in neural networks, which facilitates zero-scale and full-scale signal spans in moderate to high-speed while internal nodes' voltage swings are kept to a minimum, which enables the chip to operate with low power supplies voltages ($V_{SS}$ and $V_{DD}$) needed in battery powered and portable applications.

Another objective of the present disclosure is to arrange iMULT and iMAC in neural networks in CMOS with the option of operating the CMOS transistors in the subthreshold regions which further reduces the power consumption, and lowers the operating power supply voltage.

Another objective of this disclosure is to provide edge-based MACs ICs that are free from relying on a communications network and release them from depending on computation engines in the cloud, thereby making such edge-based MAC ICs safer, more private, more operable independently (from the cloud) and less subject to latency delays, as a trade-off for less signal processing features at slower speeds, less capacity, and less programmability.

Another objective of the present disclosure is to arrange MULT and MAC in neural networks with the option of running asynchronously (i.e., do not need clocks), which frees signal processing from noisy clocks and related digital dynamic power consumption, and noise related to free running clocks.

Another objective of the present disclosure is to arrange iMULT and iMAC in neural networks which are symmetric, matched, and scaled. Such arrangement facilitates device parameters to track each other over process, temperature, and operating conditions variations. Accordingly, temperature coefficient, power supply coefficient, and AC power supply rejection performance of iMULT and iMAC for AI & ML applications can be improved.

Another objective of the present disclosure is to desensitize overall performance of MAC ICs from power supply variations.

Another objective of the present disclosure is to desensitize the overall performance of MAC ICs from temperature variations.

Another objective of the present disclosure is to lower the sensitivity of overall performance of MAC ICs from normal manufacturing variations (e.g., normal threshold voltage variations of transistor), which could improve the silicon die yield and lower the IC cost.

Another objective of the present disclosure is to arrange iMULT and iMAC in neural networks that utilize substrate vertical Bipolar-Junction-Transistors (vBJT) that are available parasitically and at no extra cost in digital CMOS manufacturing. Further objective of the present disclosure is to utilize such vBJT in order to operate an iMULT at high-to-low input currents, and to remove the subthreshold (ultra-low current) restriction from the iMULT and iMAC.

Another objective of the present disclosure is to provide MULT and MAC that can be manufactured in main-stream Complementary-Metal-Oxide-Semiconductor (CMOS) fabrication that is low cost, readily available, with proven and rugged manufacturing quality.

Another objective of the present disclosure is to arrange MULT and MAC in neural networks without using any resistors or capacitors, which reduces manufacturing size and cost for signal processing in AI & ML end-applications.

BRIEF DESCRIPTION OF THE DRAWINGS

The subject matter presented herein is illustrated by way of example, and not by way of limitation, in the figures of the accompanying drawings and illustrations, and in which like reference numerals refer to similar elements, and in which.

SUMMARY OF THE DISCLOSURE

Figure 1:
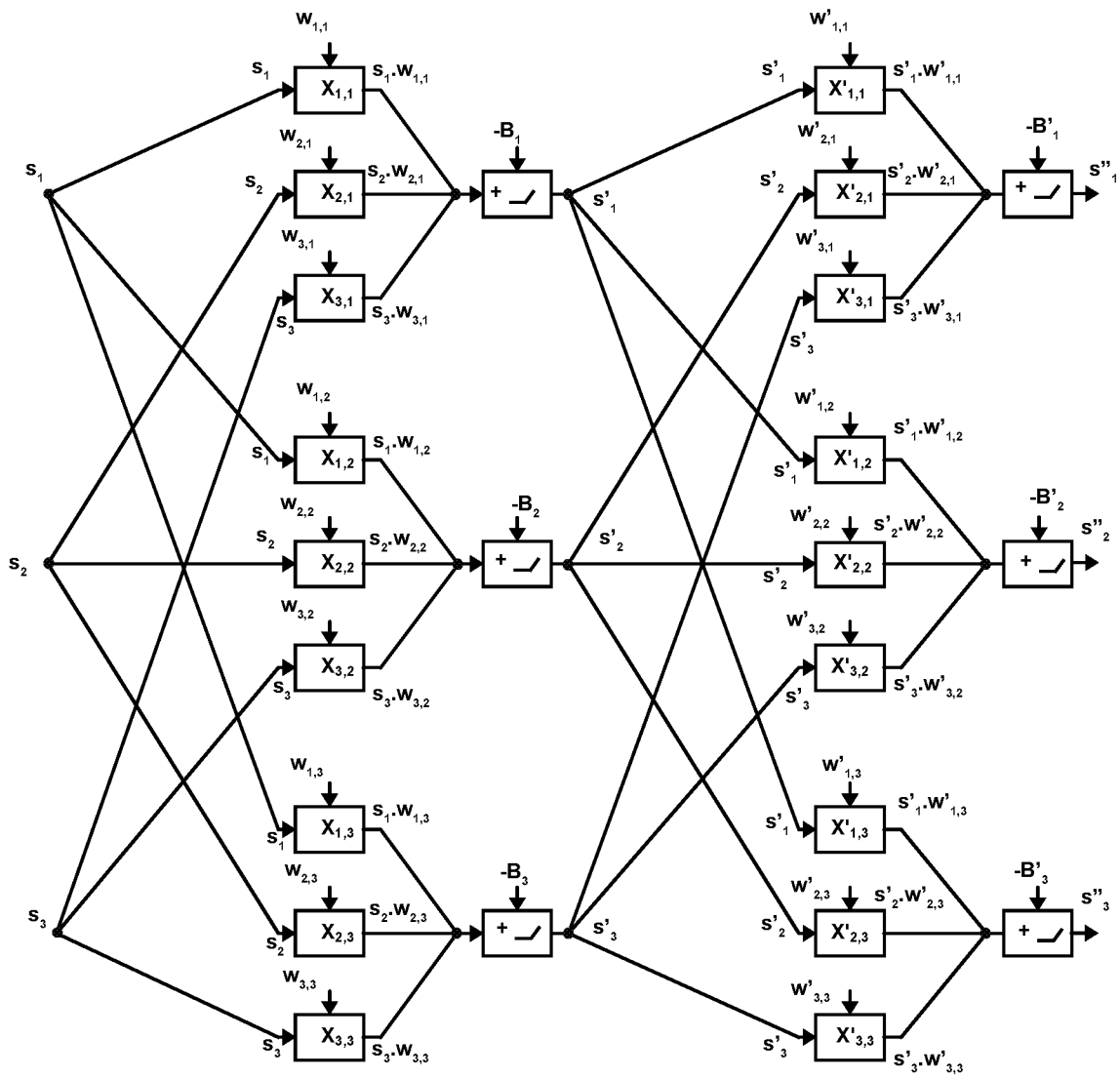
FIG. 1 is a flow chart diagram depicting a simplified neural network composed of a series of fully connected layers.

An aspect of the present disclosure is a scalar current-mode mixed-signal fully-connected neural-network method in an integrated circuit, the method comprising: Operating an at least one of a plurality of scalar multipliers ($X_{P,Q}$), each having a weight-input port (W), an scalar activation-input port (S), a reference-input port (R), and a multiplication product-output port (Z), wherein a difference signal $V_S-V_R$ is the difference between a S port voltage signal ($V_S$) and a R port voltage signal ($V_R$) of each scalar multiplier and the $V_S-V_R$ difference signal is substantially equal to a voltage signal difference between Z and W ports ($V_Z-V_W$) of each scalar multipliers, and wherein a multiplication product ($I_W \cdot I_S$) of current signals at the W port ($I_W$) and S port ($I_S$) of each scalar multiplier is substantially equal to a multiplication product ($I_R \cdot I_Z$) of current signals at the R port ($I_R$) and Z port ($I_Z$) of each scalar multiplier, and wherein in each scalar multiplier, ($V_S-V_R$) is substantially equal to ($V_Z-V_W$) and ($I_W \cdot I_S$) is substantially equal to ($I_R \cdot I_Z$): Performing scalar multiplication by a sharing a circuit that generates at least one of (1) the $V_S-V_R$ difference voltage signal, and (2) the $V_S$ and the $V_R$, with a selected of the at least one of the plurality of scalar multipliers; Arranging a 1-1 multiplier ($X_{1,1}$) in a first layer of neural network (NN) comprising: Supplying the W port of $X_{1,1}$ multiplier with a $W_{1,1}$ input-signal; Supplying the S port of $X_{1,1}$ multiplier with a $S_1$ input-signal; Supplying the R port of $X_{1,1}$ multiplier with a $R_{1,1}$ input-signal; Generating a $W_{1,1} \times S_1/R_{1,1}$ output-signal ($Z_{1,1}$) at the Z output port of the $X_{1,1}$ multiplier; Arranging a 1-2 multiplier ($X_{1,2}$) in the first layer of the NN comprising: Supplying the W port of $X_{1,2}$ multiplier with a $W_{1,2}$ input-signal; Supplying the S port of $X_{1,2}$ multiplier with a $S_1$ input-signal; Supplying the R port of $X_{1,2}$ multiplier with a $R_{1,2}$ input-signal; Generating a $W_{1,2} \times S_1/R_{1,2}$ output-signal ($Z_{1,2}$) at the Z output port of the $X_{1,2}$ multiplier; Arranging a 2-1 multiplier ($X_{2,1}$) in the first layer of the NN comprising: Supplying the W port of $X_{2,1}$ multiplier with a $W_{2,1}$ input-signal; Supplying the S port of $X_{2,1}$ multiplier with a $S_2$ input-signal; Supplying the R port of $X_{2,1}$ multiplier with a $R_{2,1}$ input-signal; Generating a $W_{2,1} \times S_2/R_{2,1}$ output-signal ($Z_{1,1}$) at the Z output port of the $X_{2,1}$ multiplier; Arranging a 2-2 multiplier ($X_{2,2}$) in the first layer of the NN comprising: Supplying the W port of $X_{2,2}$ multiplier with a $W_{2,2}$ input-signal; Supplying the S port of $X_{2,2}$ multiplier with a $S_2$ input-signal; Supplying the R port of $X_{2,2}$ multiplier with a $R_{2,2}$ input-signal; Generating a $W_{2,2} \, S_2/R_{2,2}$ output-signal ($Z_{2,2}$) at the Z output port of the $X_{2,2}$ multiplier; Summing the $Z_{1,1}$ and the $Z_{2,1}$ signals to generate a $Z_1$ signal ($Z_{1,1}+Z_{2,1}$) in the first layer of the NN; Summing the $Z_{2,1}$ and the $Z_{2,2}$ signals to generate a $Z_2$ signal ($Z_{2,1}+Z_{2,2}$) in the first layer of the NN; Subtracting a 1 Bias-Offset signal ($B_1$) from the $Z_1$ signal to generate a $S'_1$ intermediate activation signal, in the first layer of the NN, that is substantially equal to $Z_1-B_1$; and Subtracting a 2 Bias-Offset signal ($B_2$) from the $Z_2$ signal to generate a $S'_2$ intermediate activation signal, in the first layer of the NN, that is substantially equal to $Z_2-B_2$. Another aspect of the present disclosure is the scalar current-mode mixed-signal fully-connected neural-network method in an integrated circuit, the method further comprising: Arranging a 1-1' multiplier ($X'_{1,1}$) in a second layer of NN comprising: Supplying the W port of $X'_{1,1}$ multiplier with a $W'_{1,1}$ input-signal; Supplying the S port of $X'_{1,1}$ multiplier with a $S'_1$ input-signal; Supplying the R port of $X'_{1,1}$ multiplier with a $R'_{1,1}$ input-signal; Generating a $W'_{1,1} \times S'$ output-signal ($Z'_{1,1}$) at the Z output port of the $X'_{1,1}$ multiplier; Arranging a 1-2' multiplier ($X'_{1,2}$) in the second layer of the NN comprising: Supplying the W port of $X'_{1,2}$ multiplier with a $W'_{1,2}$ input-signal; Supplying the S port of $X'_{1,2}$ multiplier with a $S'_1$ input-signal; Supplying the R port of $X'_{1,2}$ multiplier with a $R'_{1,2}$ input-signal; Generating a $W'_{1,2} \times S'_1/R'_{1,2}$ output-signal ($Z'_{1,2}$) at the Z output port of the $X'_{1,2}$ multiplier; Arranging a 2-1' multiplier ($X'_{2,1}$) in the second layer of the NN comprising: Supplying the W port of $X'_{2,1}$ multiplier with a $W'_{2,1}$ input-signal; Supplying the S port of $X'_{2,1}$ multiplier with a $S'_2$ input-signal; Supplying the R port of $X'_{2,1}$ multiplier with a $R'_{2,1}$ input-signal; Generating a $W'_{2,1} \times S'_2/R'_{2,1}$ output-signal ($Z'_{1,1}$) at the Z output port of the $X'_{2,1}$ multiplier; Arranging a 2-2' multiplier ($X'_{2,2}$) in the second layer of the NN comprising: Supplying the W port of $X'_{2,2}$ multiplier with a $W'_{2,2}$ input-signal; Supplying the S port of $X'_{2,2}$ multiplier with a $S'_2$ input-signal; Supplying the R port of $X'_{2,2}$ multiplier with a $R'_{2,2}$ input-signal; Generating a $W'_{2,2} \times S'_2/R'_{2,2}$ output-signal ($Z'_{2,2}$) at the Z output port of the $X'_{2,2}$ multiplier; Summing the $Z'_{1,1}$ and the $Z'_{2,1}$ signals to generate a $Z'_1$ signal ($Z'_{1,1}+Z'_{2,1}$) in the second layer of the NN; Summing the $Z'_{2,1}$ and the $Z'_{2,2}$ signals to generate a $Z'_2$ signal ($Z'_{2,1}+Z'_{2,2}$) in the second layer of the NN; Subtracting a 1' Bias-Offset signal ($B'_1$) from the $Z'_1$ signal to generate a $S''_1$ intermediate activation signal, in the second layer of the NN, that is substantially equal to $Z'_1-B'_1$; and Subtracting a 2' Bias-Offset signal ($B'_2$) from the $Z'_2$ signal to generate a $S''_2$ intermediate activation signal, in the second layer of the NN, that is substantially equal to $Z'_2-B'_2$. Another aspect of the present disclosure is the scalar current-mode mixed-signal fully-connected neural-network method in an integrated circuit, the method further comprising: Wherein the R port of each scalar multiplier in the first NN layer can be supplied with at least of a common reference input signal (R), and individual reference input signals. Another aspect of the present disclosure is the scalar current-mode mixed-signal fully-connected neural-network method in an integrated circuit, the method further comprising: Wherein the R port of each scalar multiplier in the second NN layer can be supplied with at least of a common reference input signal (R'), and individual reference input signals. Another aspect of the present disclosure is the scalar current-mode mixed-signal fully-connected neural-network method in an integrated circuit, the method further comprising: Wherein each scalar multiplier in the first NN layer is arranged with at least one of (1) scalar substrate vertical BJT-based multipliers, (2) scalar subthreshold MOSFET-based multipliers, and (3) current-mode analog multipliers. Another aspect of the present disclosure is the scalar current-mode mixed-signal fully-connected neural-network method in an integrated circuit, the method further comprising: Wherein each scalar multiplier in the second NN layer is arranged with at least one of (1) scalar substrate vertical BJT-based multipliers, (2) scalar subthreshold MOSFET-based multipliers, and (3) current-mode analog multipliers. Another aspect of the present disclosure is the scalar current-mode mixed-signal fully-connected neural-network method in an integrated circuit, the method further comprising: performing a batch normalization function in the first NN layer on the $S'_1$ intermediate activation signal to generate an $S'1N$ normalized intermediate activation signal; and performing a batch normalization function in the first NN layer on the $S'_2$ intermediate activation signal to generate an $S'_{1N}$ normalized intermediate activation signal. Another aspect of the present disclosure is the scalar current-mode mixed-signal fully-connected neural-network method in an integrated circuit, the method further comprising: performing a batch normalization function in the second NN layer on the $S''_1$ intermediate activation signal to generate an $S''_{1N}$ normalized intermediate activation signal; and performing a batch normalization function in the second NN layer on the $S''_2$ intermediate activation signal to generate an $S''_{1N}$ normalized intermediate activation signal. Another aspect of the present disclosure is the scalar current-mode mixed-signal fully-connected neural-network method in an integrated circuit, the method further comprising: performing a ReLu function in the first NN layer on the $S'_1$ intermediate activation signal to generate an $S'_{1R}$ intermediate activation signal substantially equal to $ReLu\{Z_1-B_1\}$; and performing a ReLu function in the first NN layer on the $S'_2$ intermediate activation signal to generate an $S'_{2R}$ intermediate activation signal substantially equal to $ReLu\{Z_2-B_2\}$. Another aspect of the present disclosure is the scalar current-mode mixed-signal fully-connected neural-network method in an integrated circuit, the method further comprising: performing a ReLu function in the second NN layer on the $S''_1$ intermediate activation signal to generate an $S''_{1R}$ intermediate activation signal substantially equal to $ReLu\{Z'_1-B'_1\}$; and performing a ReLu function in the second NN layer on the $S''_2$ intermediate activation signal to generate an $S''_{2R}$ intermediate activation signal substantially equal to $ReLu\{Z'_2-B'_2\}$. Another aspect of the present disclosure is the scalar current-mode mixed-signal fully-connected neural-network method in an integrated circuit, the method further comprising: Supplying the S port of each of the $X'_{1,1}$ and $X'_{1,2}$ multipliers in the second NN layer with the intermediate activation signal $S'_{1R}$; and Supplying the S port of each of the $X'_{2,1}$ and $X'_{2,2}$ multipliers in the second NN layer with the intermediate activation signal $S'_{2R}$. Another aspect of the present disclosure is the scalar current-mode mixed-signal fully-connected neural-network method in an integrated circuit, the method further comprising: Operating a plurality of Digital-to-Analog-Converters (DAC), each having a current-output signal (O) proportional to its reference input signal (r) and responsive to its digital input code (D); Supplying at least one W code ($D_W$) to at least one of the plurality of DACs ($DAC_W$), generating an at least one O signal ($W_O$); Supplying at least one W port of at least one scalar multiplier in the first NN layer with the at least one $W_O$ signal; Supplying at least one R code ($D_R$) to at least one other of the plurality of DACs (DACs), generating an at least one R signal ($R_O$); Supplying at least one R port of at least one other scalar multiplier in the first NN layer with the at least one $R_O$ signal; and Receiving at least one of the $D_W$ and $D_R$ codes from at least one of a Latch array, a Static-Random-Access-Memory (SRAM) array, an Erasable-Programmable-Read-Only-Memory (EPROM) array, and an Electrically-Erasable-Programmable-Read-Only-Memory ($E^2$PROM) array. Another aspect of the present disclosure is the scalar current-mode mixed-signal fully-connected neural-network method in an integrated circuit, the method further comprising: Operating a plurality of Digital-to-Analog-Converters (DAC), each having a current-output signal (O) proportional to its reference input signal (r) and responsive to its digital input code (D); Supplying at least one W code ($D_W$) to at least one of the plurality of DACs ($DAC_W$), generating an at least one O signal ($W_O$); Supplying at least one W port of at least one scalar multiplier in the second NN layer with the at least one $W_O$ signal; Supplying at least one R code ($D_R$) to at least one other of the plurality of DACs (DACs), generating an at least one R signal ($R_O$); Supplying at least one R port of at least one other scalar multiplier in the second NN layer with the at least one $R_O$ signal; and Receiving at least one of the $D_W$ and $D_R$ codes from at least one of a Latch array, a Static-Random-Access-Memory (SRAM) array, an Erasable-Programmable-Read-Only-Memory (EPROM) array, and an Electrically-Erasable-Programmable-Read-Only-Memory ($E^2$PROM) array.

An aspect of the present disclosure is a scalar current-mode mixed-signal fully-connected neural-network method in an integrated circuit, the method comprising: Operating a plurality of Digital-to-Analog-Converters (DAC), each having a current-output signal (O) proportional to its reference input signal (r) and responsive to its digital input code (D); Operating a plurality of Reference Bias Networks (RBN), the output of each generating a plurality of reference voltage bus signals (VRi) responsive to binary weighted currents, each binary weighted current proportional to a respective RBN input current signal ($I_{RBN}$); Operating a plurality of Tiny DACs (tDAC), the current-output signal (OT) of each being proportional to a plurality of voltage reference signals ($REF_i$) and responsive to its digital input code (DT); Supplying a $S_1$ activation input code ($D_{S1}$) to a $DAC_{S1}$ to generate a $O_{S1}$ output signal in a first neural network (NN) layer, wherein the $O_{S1}$ signal is substantially the same as the $I_{RBN}$ of a $R_{BNS1}$, and generating a plurality of $VRi_{S1}$ reference voltage signals; Supplying a $W_{1,1}$ digital input code to a $tDAC_{1,1}$ in the first NN layer, wherein the plurality of $VRi_{S1}$ reference voltage signals is substantially the same as the REF' of the $tDAC_{1,1}$, and generating a $Z_{1,1}=S_1 \times W_{1,1} \times 1/r$ scalar multiplication product output signal; Supplying a $W_{1,2}$ digital input code to a $tDAC_{1,2}$ in the first NN layer, wherein the plurality of $VRi_{S1}$ reference voltage signals is substantially the same as the $REF_i$ of the $tDAC_{1,2}$, and generating a $Z_{1,2}=S_1 \times W_{1,2} \times 1/r$ scalar multiplication product output signal; Supplying a $S_2$ activation input code ($D_{S2}$) to a $DAC_{S2}$ to generate a $O_{S2}$ output signal in the first NN layer, wherein the $O_{S2}$ signal is substantially the same as the $I_{RBN}$ of a $RBN_{S2}$, and generating a plurality of $VRi_{S2}$ reference voltage signals; Supplying a $W_{2,1}$ digital input code to a $tDAC_{2,1}$ in the first NN layer, wherein the plurality of $VRi_{S2}$ reference voltage signals is substantially the same as the $REF_i$ of the $tDAC_{2,1}$, and generating a $Z_{2,1}=S_2 \times W_{2,1} \times 1/r$ scalar multiplication product output signal; Supplying a $W_{2,2}$ digital input code to a $tDAC_{2,2}$ in the first NN layer, wherein the plurality of $VRi_{S2}$ reference voltage signals is substantially the same as the $REF_i$ of the $tDAC_{2,2}$, and generating a $Z_{2,2}=S_2 \times W_{2,2} \times 1/r$ scalar multiplication product output signal; Summing the $Z_{1,1}$ and the $Z_{2,1}$ signals to generate a $Z_1$ signal ($Z_{1,1}+Z_{2,1}$) in the first layer of the NN; Summing the $Z_{2,1}$ and the $Z_{2,2}$ signals to generate a $Z_2$ signal ($Z_{2,1}+Z_{2,2}$) in the first layer of the NN; Subtracting a 1 Bias-Offset signal ($B_1$) from the $Z_1$ signal to generate a $S'_1$ intermediate activation signal, in the first layer of the NN, that is substantially equal to $Z_1-B_1$; and Subtracting a 2 Bias-Offset signal ($B_2$) from the $Z_2$ signal to generate a $S'_2$ intermediate activation signal, in the first layer of the NN, that is substantially equal to $Z_2-B_2$. Another aspect of the present disclosure is the scalar current-mode mixed-signal fully-connected neural-network method in an integrated circuit, the method further comprising: Supplying a S', activation input code ($D_{S'1}$) to a $DAC_{S'1}$ to generate an $O_{S'1}$ output signal in a second neural network (NN) layer, wherein the $O_{S'1}$ signal is substantially the same as the $I_{RBN}$ of a $RBN_{S'1}$, and generating a plurality of $VRi_{S'1}$ reference voltage signals; Supplying a $W'_{1,1}$ digital input code to a $tDAC'_{1,1}$ in the second NN layer, wherein the plurality of $VRi_{S'1}$ reference voltage signals is substantially the same as the $REF_i$ of the $tDAC'_{1,1}$, and generating a $Z_{1,1}=S_1 \times 1/r$ scalar multiplication product output signal; Supplying a $W'_{1,2}$ digital input code to a $tDAC'_{1,2}$ in the second NN layer, wherein the plurality of $VRi_{S'1}$ reference voltage signals is substantially the same as the $REF_i$ of the $tDAC'_{1,2}$, and generating a $Z'_{1,2}=S'_1 \times W'_{1,2} \times 1/r$ scalar multiplication product output signal; Supplying a $S'_2$ activation input code ($D_{S'2}$) to a $DAC_{S'2}$ to generate an $O_{S'2}$ output signal in the second NN layer, wherein the $O_{S'2}$ signal is substantially the same as the $I_{RBN}$ of a $RBN_{S'2}$, and generating a plurality of $VRi_{S'2}$ reference voltage signals; Supplying a $W'_{2,1}$ digital input code to a $tDAC'_{2,1}$ in the second NN layer, wherein the plurality of $VRi_{S'2}$ reference voltage signals is substantially the same as the $REF_i$ of the $tDAC'_{2,1}$, and generating a $Z'_{2,1}=S'_2 \times W'_{2,1} \times 1/r$ scalar multiplication product output signal; Supplying a $W'_{2,2}$ digital input code to a $tDAC'_{2,2}$ in the second NN layer, wherein the plurality of $VRi_{S'2}$ reference voltage signals is substantially the same as the $REF_i$ of the $tDAC'_{2,2}$, and generating a $Z'_{2,2}=S'_2 \times W'_{2,2} \times 1/r$ scalar multiplication product output signal; Summing the $Z'_{1,1}$ and the $Z'_{2,1}$ signals to generate a $Z'_1$ signal ($Z'_{1,1}+Z'_{2,1}$) in the first layer of the NN; Summing the $Z'_{2,1}$ and the $Z'_{2,2}$ signals to generate a $Z'_2$ signal ($Z'_{2,1}+Z'_{2,2}$) in the first layer of the NN; Subtracting a 1' Bias-Offset signal ($B'_1$) from the $Z'_1$ signal to generate a $S''_1$ intermediate activation signal, in the first layer of the NN, that is substantially equal to $Z'_1-B'_1$; and Subtracting a 2' Bias-Offset signal ($B'_2$) from the $Z'_2$ signal to generate a $S''_2$ intermediate activation signal, in the first layer of the NN, that is substantially equal to $Z'_2-B'_2$. Another aspect of the present disclosure is the scalar current-mode mixed-signal fully-connected neural-network method in an integrated circuit, the method further comprising: performing a ReLu function on the $S'_1$ signal to generate an $S'_{1R}$ intermediate activation signal substantially equal to $ReLu\{Z_1-B_1\}$; and performing a ReLu function on the $S'_2$ signal to generate an $S'_{2R}$ intermediate activation signal substantially equal to $ReLu\{Z_2-B_2\}$. Another aspect of the present disclosure is the scalar current-mode mixed-signal fully-connected neural-network method in an integrated circuit, the method further comprising: wherein the intermediate activation signal 1R is substantially the same as the $I_{RBN}$ of a $RBN_{S'1}$; and wherein the intermediate activation signal $S'_{2R}$ is substantially the same as the $I_{RBN}$ of a $RBN_{S'2}$. Another aspect of the present disclosure is the scalar current-mode mixed-signal fully-connected neural-network method in an integrated circuit, the method further comprising: performing a batch normalization function on the $S'_1$ signal to generate an $S'_{1N}$ normalized intermediate activation signal; and performing a batch normalization function on the $S'_2$ signal to generate an $S'_{1N}$ normalized intermediate activation signal. Another aspect of the present disclosure is the scalar current-mode mixed-signal fully-connected neural-network method in an integrated circuit, the method further comprising: wherein the normalized intermediate activation signal $S'_{1N}$ is substantially the same as the $I_{RBN}$ of a $RBN_{S'1}$; and wherein the normalized intermediate activation signal $S'_{2N}$ is substantially the same as the $I_{RBN}$ of a $RBN_{S'2}$.

An aspect of the present disclosure is a programmable statistical distribution of MAC signals method in a mixed-signal fully-connected neural-network in an integrated circuit, the method comprising: Programming at least one of (1) an at least one of a plurality of multi-quadrant weight signals W, (2) an at least one of a plurality of multi-quadrant activation signals S, (3) an at least one of a plurality of multi-quadrant multiplication products signals W×S, and (4) an at least one of a plurality of multi-quadrant multiply-Accumulate signals ΣW×S having a signal distribution profile at key summation nodes that is at least one of (1) a uniform distribution, (2) a specific dynamic range, and (3) a gaussian distribution with an average and a sigma.

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Be mindful that all the figures comprised of circuits, blocks, or systems illustrated in this disclosure are powered up by positive power supply $V_{DD}$ and negative power supply $V_{SS}$, wherein $V_{SS}$ can be connected to the ground potential or zero volts. Terms Deep Neural Networks (DNN), Fully Connected Artificial Neural networks (ANN), Neural Networks composed of series of fully connected layers, and Dense Neural Networks (DNN) can be used interchangeably. MAC stands for Multiply-Accumulate. SRAM is static random-access memory. DRAM is dynamic random-access memory. EPROM is erasable programmable read only memory. E$^2$PROM is electrically EPROM. CIM stands for Compute-In-Memory, IMC stands for In-Memory-Compute, CNM stands for Compute-Near-Memory, and NMC stands for Near-Memory-Compute. The term PSR stands for power supply desensitization circuit. MSB is Most-Significant-Bit, LSB is Least-Significant-Bit, LSP is Least-Significant-Portion (e.g., a digital word not including its MSB). Terms FET is Field-Effect-Transistor; MOS is Metal-Oxide-Semiconductor; MOSFET is MOS FET; PMOS is P-channel or P-type MOS; NMOS is N-channel or N-type MOS; BiCMOS is Bipolar CMOS. The term BJT is Bipolar-Junction Transistor. The terms 'port' or 'terminal' or 'node' are used interchangeably throughout this disclosure. The terms 'power supply voltage' or 'supply voltage' are used interchangeably throughout this disclosure. The body terminal of NMOSFET can be connected to its source terminal of NMOSFET or to $V_{SS}$, throughout this disclosure. Also, the body terminal of PMOSFET can be connected to the source terminal of PMOSFET or to $V_{DD}$ throughout this disclosure. The term VGS or $V_g$s are gate-to-source voltage for a MOSFET. The term VDS is drain-to-source voltage for a MOSFET. The term IDS or ID is drain current of a MOSFET (e.g., also $I_{M1}$, $I_{dM1}$, or $I_{DM1}$ are drain current of $M_1$ that is a MOSFET). The term $V_{BE}$ or $V_{BE}$ is base-to-emitter voltage of a BJT. The term $I_C$ is Collector Current of a BJT and $I_E$ is emitter current of a BJT (e.g., also $I_Q$, $I_{cQ1}$, $I_{cq1}$ or $I_{CEq1}$ or $I_{CEQ1}$ is a current of Qi that is a BJT). The term $I_N$, $I_P$, $I_M$ is drain current of a p-channel or n-channel MOSFET. Channel width over channel length is W/L which is the size of a MOSFET. This disclosure utilizes BJT or subthreshold MOS transistors (T) whose input-voltage ($V_1$) to output-current ($i_O$) transfer function approximately follows an exponential profile.

Keep in mind that for descriptive clarity, illustrations of this disclosure may be simplified, and their improvements beyond simple illustrations would be obvious to one skilled in the art. For example, it would be obvious for one skilled in the art that MOSFET current sources can be cascoded for higher output impedance and lower sensitivity to power supply variations, whereas throughout this disclosure current sources may be depicted with a single MOSFET for clarity of illustration. It would also be obvious to one skilled in the art that a circuit schematic illustrated in this disclosure may be arranged with NMOS transistors or arranged in a complementary version utilizing transistors such as PMOS.

The MOSFETs that operate in the subthreshold region follow an approximate exponential $v_I$ to $i_O$ transfer function that can approximately be represented as follows: $i_D \approx$ $$I_{DO} \times \frac{W}{L} \times e^{\frac{v_{GS}-V_{TH}}{n \times V_t}}$$

or $$v_{GS} - V_{TH} \approx n \times V_t \times \ln\left[\frac{i_D}{I_{DO} \times \frac{W}{L}}\right]$$

where for a MOSFET, the $V_{TH}$ is threshold voltage, $v_{GS}$ is voltage between gate-terminal to source-terminal, $i_D$ is current through the drain terminal, $$\frac{W}{L}$$

is a channel-width over channel-length ratio, $V_t$ is thermal voltage, n is slope factor, $I_{DO}$ is the characteristics current when $v_{GS} \approx V_{TH}$. Note that in the case of a MOSFET operating in subthreshold, $v_I$ corresponds to $V_{GS}$ and $i_O$ corresponds to $i_D$ or $i_{DS}$. Moreover, note that for two equally sized and same type subthreshold MOSFET the approximate relationship $$v_{GS1} - v_{GS2} \approx n \times V_t \times \ln\left[\frac{i_{D1}}{i_{D2}}\right]$$

holds, wherein $v_{GS1}$ and $v_{GS2}$ are the first and second MOSFET's $v_{GS}$s or $v_I$s, and $i_{D1}$, $I_{D2}$ are the first and second MOSFET's $i_D$s or $i_O$s. Note that throughout this disclosure, MOSFETs that operate in subthreshold (which are utilized as the core four MOSFETs in current subthreshold MOSFET-based multipliers) have equal W/L, unless otherwise specified.

A bipolar-junction-transistor (BJT) follows an approximate exponential $v_I$ to $i_O$ transfer function that can be represented as follows:

$$i_E \approx I_{ES} \times \left[e^{\frac{v_{BE}}{V_t}} - 1\right]$$

or $$v_{BE} \approx V_t \times \ln\left[\frac{i_E}{I_{ES}}\right]$$

where for a BJT, $i_E$ is the emitter current, $v_{BE}$ is the base-emitter voltage, $V_t$ is thermal voltage, $I_{ES}$ is the reverse saturation current of the base-emitter diode. In the case of a BJT, $v_I$ corresponds to $V_{BE}$ and $i_O$ corresponds to $i_E$ or $I_C$. Moreover, keep in mind that for two equally sized emitter area and same type BJTs $$v_{BE1} - v_{BE2} \approx V_t \times \ln\left[\frac{i_{E1}}{i_{E2}}\right]$$

holds where $v_{BE1}$, $v_{BE2}$ are the first and second BJT's $v_{BE}$s or $v_I$s, and $i_{E1}$, $I_{E2}$ are the first and second BJT's $i_E$s or $i_O$s. Be mindful that throughout this disclosure, parasitic vertical substrate BJTs (which are utilized as the core four BJTs in current multipliers) have equal emitter area, unless otherwise specified.

Keep in mind that other manufacturing technologies, such as FINFET, Bipolar, BiCMOS, junction field effect transistors (JFET), Gallium Arsenide, Gallium Nitride, Dielectric Isolation, Silicon on Sapphire, Silicon on Oxide, and others can utilize this disclosure in whole or part.

The illustrated circuit schematics of embodiments described in the proceeding sections may have some of the following benefits, some of which are outlined here to avoid repetition in each forthcoming section in the interest of clarity and brevity:

First, in current-mode signal processing because voltage swings are small (all else equal) the disclosed mixed-signal current-mode circuits are inherently faster compared to voltage mode-signal processing. As such the disclosed circuits can provide a choice of trade-off and flexibility between running at moderate speeds and operating with low currents to save on power consumption. Moreover, smaller voltage swings along the current-mode signal paths enables operations at lower $V_{DD}$ and $V_{SS}$ which helps with lower power consumption. Also, because voltage swings are small in current-mode signal processing, the disclosed circuits can enable internal analog signals to span between full-scale and zero-scale (i.e., full-scale dynamic range) while being less restricted by power supply voltage $V_{DD}$ and $V_{SS}$ levels, as compared with voltage-mode signal processing.

Second, the disclosed mixed-signal current-mode circuit designs (such as that of the weight data-converters) can be arranged on a silicon die right next to memory such as SRAM to facilitate Compute-In-Memory (CIM) or Near-Memory-Compute (NMC) operation. Such an arrangement can lower overall dynamic power consumption associated with the read/write cycles into an out of memory.

Third, generally mixed-mode and analog MACs require plurality of ADCs and memory (e.g., SRAM) as well as DACs for store/process intermediate activation signals through hidden layers of a neural network. The disclosed mixed-signal current-mode circuit designs eliminate the need for intermediate ADC. It also avoids the need for respective memory or register functions that store the intermediate or partial digital summations as well as the subsequent respective intermediate Digital-to-Analog Converter (DAC). Such a trait has the additional benefit of saving digital memory area and reducing the dynamic power consumption associated with read-write cycles into and out of memory related to intermediate activation signals.

Fourth, the disclosed mixed-signal circuit designs operating in current-mode, facilitates simple, low cost, and fast summation and or subtraction functions. For example, summation of plurality of analog currents could be accomplished by simply coupling plurality of current signals. Depending on accuracy and speed requirements, subtraction of analog current signals could be accomplished by utilizing a current mirror where the two analog current signals are applied to the opposite side of the current mirror, for example.

Fifth, majority of the disclosed mixed-signal current-mode circuits, can operate with low power supply voltages since their operating headroom can be generally limited to a FET's $V_{GS}+V_{DS}$. Moreover, operating some of the MOSFETs of the disclosed circuits in the subthreshold region enables the disclosed mixed-signal current-mode circuits to operate with ultra-low currents, even lower supply voltage levels, and ultra-low power consumption.

Sixth, for some data-sets of some machine learning applications, the population and or combinations of activation and weight signals can be programmable and/or their combination can be uniformly distributed by being trained to a specific dynamic range at key summation node (e.g., Gaussian distribution with an average and a sigma). Some of the disclosed circuits are arranged for such statistical distribution profile of summation signals such that, for example, MAC summation node's signal swings would follow a more defined and bounded profile along signal processing paths, which avoid over-flow conditions, can reduce power consumption and improve speed attributed to such signal paths and or summation nodes/wires.

Seventh, some of the disclosed mixed-signal current-mode circuits can perform 'scalar multiplications' by arranging iMULT and iMAC in neural networks such that a reference bias network (RBN) distributes an activation signal (scalar). As such, a scalar/activation signal can be multiplied with a plurality of weight signals, (arranged with tiny multiplying data-converter) without being constrained by subthreshold operations, thereby enabling full-scale signal swings at summation nodes while reducing power consumption and silicon dies size. Also, some of the other disclosed mixed-signal current-mode circuits can perform 'scalar multiplications' by utilizing MOSFETs that operate in subthreshold. In such subthreshold MOSFET-based scalar multiplier, activation signal (scalar) circuitry and reference signal circuitry are shared with a plurality of weight input circuitries and product outputs circuitries which saves silicon area, reduces current consumptions, and improves matching between product outputs. Furthermore, some of the other disclosed mixed-signal current-mode circuits can perform 'scalar multiplications' by arranging parasitic substrate vertical BJT (in standard CMOS) that are not constrained by subthreshold operations. Such parasitic substrate vBJT-based multiplier, enable full-scale signal swings at summation nodes, wherein an activation signal (scalar) and reference signal circuitry are shared with a plurality of weight inputs circuitries and product outputs circuitries. Such arrangements also save silicon area, reduces current consumptions, and improves matching between product outputs, in an area and current efficient manner.

Eight, the disclosed mixed-signal current-mode circuits do not require capacitors nor resistors, which reduces die size and die cost, and facilitates their fabrication in mainstream and readily available standard digital CMOS that is low cost and suitable for rugged high-quality high-volume mass production.

Ninth, the disclosed mixed-signal current-mode circuits are free of clock, suitable for asynchronous (clock free) computation. As such, there is no clock related noise on power supplies and there is no dynamic power consumption due to a digital logic.

Tenth, some of the disclosed mixed-signal current-mode circuits are arranged in a symmetric, matched, and scaled manner. This trait facilitates devices parameters to track each other over process, temperature, and operating condition variations. Accordingly, the disclosed circuit's temperature coefficient and power supply rejection performance can be enhanced.

Eleventh, the disclosed mixed-signal current-mode circuits enable "always-on" operation wherein for a meaningful portion of the computation circuitry to shut itself off (i.e., 'smart self-power-down') in the face of no incoming signal. For example, where a zero (scalar) activation input signal is supplied to a RBN (in a multiplying DAC arrangements) or when a zero-weight signal is supplied to input of subthreshold CMOS multiplier or a vBJT multiplier, the output of the respective multipliers generate zero current and consume zero-power.

Twelves, digital computation is generally accurate but it may be excessively power hungry. Current-mode analog and mixed-signal computation that is disclosed here leverage the trade off in analog signal processing between low power and analog accuracy in form of signal degradation, but not total failures. This trait can provide the AI & ML end-application with approximate results to work with instead of experiencing failed results.

Thirteenth, to reduce sensitivity to power supply variations, the disclosed mixed-signal current-mode circuits can be arranged with power supply desensitization circuits that regulates a central reference current or a RBN output signal before supplying the raw reference signal to weight data converters. Such an arrangement, enables keeping the weight data-converters small which saves on silicon die area. Alternatively, cascading current sources of weight data-converters can help increase output impedance and reduce sensitivity of output currents of data-converters to power supply variations.

Fourteenth, the disclosed MAC ICs operating in current-mode (having smaller voltage swings along the signal computation path) are less constrained by analog signal overflow constraints at summation nodes as compared to voltage mode circuits wherein summation of MAC voltages is generally bound by power supply voltage $V_{DD}$ and $V_{SS}$ levels.

Fifteenth, the disclosed mixed-signal voltage-mode or current-mode circuit designs can be manufactured on low-cost standard and conventional Complementary-Metal-Oxide-Semiconductor (CMOS) fabrication, which are more mature, readily available, and process node portable than "bleeding-edge" technologies, thereby facilitating embodiments of ICs having relatively more rugged reliability, multi-source manufacturing flexibility, and lower manufacturing cost.

Sixteenth performance of some of the disclosed mixed-signal current-mode circuit embodiments can be arranged to be independent of resistors and capacitor values and their normal variations in manufacturing. As such, manufacturing die yield can perform to specifications mostly independent of passive resistor or capacitor values and their respective manufacturing variations, which could otherwise reduce die yield and increase cost.

Seventeenth, the disclosed MAC ICs operating in current-mode wherein the digital weight signals are converted to analog currents (utilizing the RBN circuit) that saves substantial die area. The RBN decouples the need for individually weighted current sources to be constructed from individually scaled current sources. The RBN feeds a group of binary weighted currents onto a respective group of equally 1X scaled (diode connected) FETs which generate a 'bias voltage bus' which are plurality of reference voltage signals. The 'bias voltage bus' can then be supplied to sea of tiny data-converters, whose tiny reference network can be programmed with binary weights (without being binarily scaled) by tapping into the equally 1X scaled diode connected FETs of the RBN (bias voltage bus). Accordingly, scalar multiplications can be performed while saving on silicon die area and improving the dynamic response of (sea of tiny) data-converters whose binary weighted current reference network is comprised of tiny equally sized 1X current switches instead of large binary-sized current switches. Such an arrangement also saves substantial die area, power consumption, enhances speed, and improves matching between scaled multiplication (product) outputs.

Eighteenth, some of the disclosed mixed-signal current-mode circuits can perform the ReLu function by supplying summation signals across a circuit that functions like a diode, which save on silicon area and improves speed. For example, in some of the disclosed circuits, the activation inputs to scalar multiplications circuits are diode-connected (e.g., reference input port of RBN circuits, subthreshold MOSFET based current-mode multipliers input port, and vBJT based current-mode multipliers input port). Moreover, a current mode data-converter can supply a B signal as Bias Offset current term ($Z_O = \Sigma S_i W_i + B$) onto the same diode-connected summation port. Thus, the functions of current-mode summation and ReLu and Bias Offset insertion can be performed in an area efficient manner avoiding complex circuitry.

Nineteenth, the operating current of the disclosed mixed-signal current-mode circuits for 'approximate computation' can be dynamically tuned in package level in accordance with end-applications power-speed-accuracy requirements. For example, applications requiring ultra-low power consumption can program the operating currents, speed, and accuracy of MACs to lower levels with certain limits and vice versa.

Section 1—Description of FIG. 1

FIG. 1 is a flow chart diagram depicting a simplified neural network composed of a fully connected layer representing a matrix multiplication below:

$$\begin{bmatrix} w_{1,1} & w_{2,1} & w_{3,1} \\ w_{1,2} & w_{2,2} & w_{3,2} \\ w_{1,3} & w_{2,3} & w_{3,3} \end{bmatrix} \times \begin{bmatrix} S_1 \\ S_2 \\ S_3 \end{bmatrix} = \begin{bmatrix} Z_1 \\ Z_2 \\ Z_3 \end{bmatrix} = \begin{bmatrix} S_1 \times w_{1,1} + S_2 \times w_{2,1} + S_3 \times w_{3,1} \\ S_1 \times w_{1,2} + S_2 \times w_{2,2} + S_3 \times w_{3,2} \\ S_1 \times w_{1,3} + S_2 \times w_{2,3} + S_3 \times w_{3,3} \end{bmatrix}$$

$$\begin{bmatrix} S'_1 \\ S'_2 \\ S'_3 \end{bmatrix} =$$

$$ReLu\left\{\begin{bmatrix} Z_1 \\ Z_2 \\ Z_3 \end{bmatrix} - \begin{bmatrix} B_1 \\ B_2 \\ B_3 \end{bmatrix}\right\} = ReLu\left\{\begin{bmatrix} S_1 \times w_{1,1} + S_2 \times w_{2,1} + S_3 \times w_{3,1} - B_1 \\ S_1 \times w_{1,2} + S_2 \times w_{2,2} + S_3 \times w_{3,2} - B_2 \\ S_1 \times w_{1,3} + S_2 \times w_{2,3} + S_3 \times w_{3,3} - B_3 \end{bmatrix}\right\}$$

In other words:

$S'_1 = ReLu\{S_1 \times w_{1,1} + S_2 \times w_{2,1} + S_3 \times w_{3,1} - B_1\}$ $S'_2 = ReLu\{S_1 \times w_{1,2} + S_2 \times w_{2,2} + S_3 \times w_{3,2} - B_2\}$ $S'_3 = ReLu\{S_1 \times w_{1,3} + S_2 \times w_{2,3} + S_3 \times w_{3,3} - B_3\}$ Similarly, matrix multiplication attributed to next layer can be represented as follows:

$$\begin{bmatrix} w'_{1,1} & w'_{2,1} & w'_{3,1} \\ w'_{1,2} & w'_{2,2} & w'_{3,2} \\ w'_{1,3} & w'_{2,3} & w'_{3,3} \end{bmatrix} \times \begin{bmatrix} S'_1 \\ S'_2 \\ S'_3 \end{bmatrix} = \begin{bmatrix} Z'_1 \\ Z'_2 \\ Z'_3 \end{bmatrix} = \begin{bmatrix} S'_1 \times w'_{1,1} + S'_2 \times w'_{2,1} + S'_3 \times w'_{3,1} \\ S'_1 \times w'_{1,2} + S'_2 \times w'_{2,2} + S'_3 \times w'_{3,2} \\ S'_1 \times w'_{1,3} + S'_2 \times w'_{2,3} + S'_3 \times w'_{3,3} \end{bmatrix}$$

$$\begin{bmatrix} S''_1 \\ S''_2 \\ S''_3 \end{bmatrix} =$$

$$ReLu\left\{\begin{bmatrix} Z'_1 \\ Z'_2 \\ Z'_3 \end{bmatrix} - \begin{bmatrix} B'_1 \\ B'_2 \\ B'_3 \end{bmatrix}\right\} = ReLu\left\{\begin{bmatrix} S'_1 \times w'_{1,1} + S'_2 \times w'_{2,1} + S'_3 \times w'_{3,1} - B'_1 \\ S'_1 \times w'_{1,2} + S'_2 \times w'_{2,2} + S'_3 \times w'_{3,2} - B'_2 \\ S'_1 \times w'_{1,3} + S'_2 \times w'_{2,3} + S'_3 \times w'_{3,3} - B'_3 \end{bmatrix}\right\}$$

In other words:

$S''_1 = ReLu\{S'_1 \times w'_{1,1} + S'_2 \times w'_{2,1} + S'_3 \times w'_{3,1} - B'_1\}$ $S''_2 = ReLu\{S'_1 \times w'_{1,2} + S'_2 \times w'_{2,2} + S'_3 \times w'_{3,2} - B'_2\}$ $S''_3 = ReLu\{S'_1 \times w'_{1,3} + S'_2 \times w'_{2,3} + S'_3 \times w'_{3,3} - B'_3\}$ In the forthcoming sections, a series of disclosed circuits are arranged in analog and mixed-mode to perform the scalar multiplication function (for neural network composed of fully connected layers to represent the matrix multiplication function), which offer combined benefits in silicon die area savings, enhanced matching, faster speeds, and lower power consumption.

Figure 2:
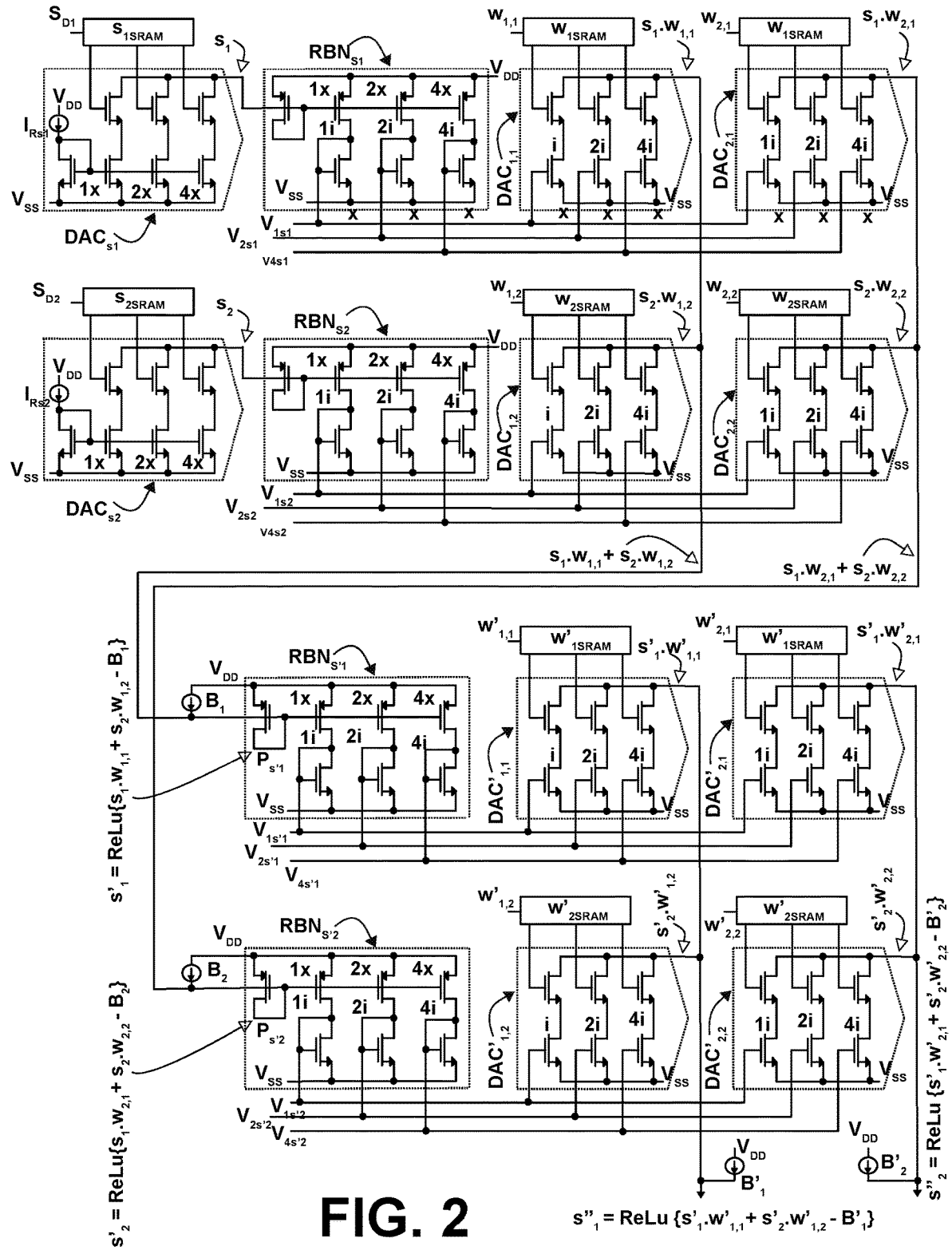
FIG. 2 is a circuit schematic illustrating a simplified embodiment of a current-mode neural network comprising of fully connected layers arranged in accordance with scalar current-mode mixed-signal fully-connected neural-network method.

Section 2—Description of FIG. 2

FIG. 2 is a circuit schematic illustrating a simplified embodiment of a current-mode neural network comprising of fully connected layers arranged in accordance with scalar current-mode mixed-signal fully-connected neural-network method.

Free from intermediate Analog-to-Digital (ADC) and intermediate activation memory and intermediate activation Digital-to-Analog Converter (DAC), the disclosed simplified embodiment of FIG. 2 operates in current-mode and utilizes reference bias networks (RBN), iDACs, and SRAMs (for CIM or NMC).

For clarity of illustration and description of FIG. 2, a simple fully connected network with a few layers is depicted that is inputted with a pair of activation signals (e.g., $S_{D1}$, $S_{D2}$) along with two pairs of weight signals ($W_{1,1}$; $W_{2,1}$; and $W_{1,2}$; $W_{2,2}$) for its first layer. In FIG. 2, the ReLu'd pair of activation signals generated in the first layer (e.g., $S'_{D1}$, $S'_{D2}$) which are current-signals are inputted (without being converted to code by an ADC) to the next layer along with a two pairs of weight signal codes ($W'_{1,1}$; $W'_{2,1}$; and $W'_{1,2}$; $W'_{2,2}$) for its second layer.

It would be obvious to one skilled in the arts that variations of neural networks with more layers, more activation signal, and more weight signals can be arranged utilizing the scalar current-mode mixed-signal fully-connected neural-network method disclosed herein. Please also note that weight code signals can be stored on local memory (e.g., SRAM) right next to weight DACs which would facilitate CIM to save on dynamic power consumption associated with loading the neural network with weight training codes.

An activation signal code Sm programs $DAC_{S1}$ to generate a $S_1$ current output signal that is fed onto $R_{BNS1}$. In $R_{BNS1}$ of FIG. 2, the $S_1$ signal representing a scalar signal is first transformed into a group of binary weighted currents (e.g., 1X→1i, 2X→2i, 4X→4i, etc.) which are next inputted onto a group of respective equally sized diode connected FETs (e.g., 1X) to generate a first 'bias voltage bus' which are plurality of reference voltage signals (e.g., $V_{1S1}$, $V_{2S1}$, $V_{4S1}$, etc.). The first 'bias voltage bus' is shared with a selected group of tiny multiplying weight DACs (e.g., $DAC_{1,1}$; $DAC_{2,1}$; etc.). Note that weights DACs can generate binarily weighted currents by coupling their reference networks onto the shared first 'bias voltage bus'. Notice that each multiplying weight DAC's reference network is only comprised of equally sized (e.g., 1X) current switch FETs, which arranges the multiplying weight DACs very tiny. A group of weight signal codes (e.g., $W_{1,1}$; $W_{2,1}$; etc.) pre-stored on a localized SRAM are inputted to a respective group of multiplying tiny DACs to generate a group of scalar multiplication products (e.g., $S_1 \times W_{1,1}$; $S_2 \times W_{2,1}$; etc.).

Notice that the 'bias voltage bus' which are plurality of reference voltage signals can be shared with a sea of multiplying tiny weight DACs, and as such the disclosed scalar current-mode mixed-signal fully-connected neural-network method can generate a sea of scalar multiplication products in a manner that is scalable and area efficient. Moreover, because the multiplying tiny DAC's reference networks are comprised of equally sized 1X FETs, they are fast and generate less glitch. Moreover, multiplying tiny DAC's output port is fast because it carries significantly less parasitic switch capacitance when compared to conventional DACs which rely on large binarily sized current switches for their reference networks.

Also, notice that in the face of zero-signals (e.g., zero activation signal and/or zero weight signal), the scalar current-mode mixed-signal fully-connected neural-network method facilitates an inherent 'self-power down' (e.g., if either $S_1$ or $W_{1,1}$ signal are zero, then output currents and thus the power consumption of $DAC_{1,1}$ is zero).

Similar to the Sm signal path, an activation signal code $S_{D2}$ programs $DAC_{S2}$ to generate a $S_2$ current output signal that is fed onto $RBN_{S2}$. In $RBN_{S2}$ of FIG. 2, the $S_2$ signal representing a scalar signal is transformed into a group of binary weighted currents (e.g., 1X→1i, 2X→2i, 4X→4i, etc.) that are inputted onto a series of respective equally sized diode connected FETs (e.g., 1X) to generate a second 'bias voltage bus' which are plurality of reference voltage signals (e.g., $V_{1S2}$, $V_{2S2}$, $V_{4S2}$, etc.). The second 'bias voltage bus' which are plurality of reference voltage signals is shared with a group of weight DACs (e.g., $DAC_{1,2}$ and $DAC_{2,2}$). Note that each of multiplying weight DACs here can generate binarily weighted currents by arranging each multiplying weight DAC's reference network to tap into the shared second 'bias voltage bus' which are plurality of reference voltage signals. Similarly, notice that multiplying weight DAC's reference network is also comprised of equally sized (e.g., 1X) current switch FETs, which also makes the weight DACs here tiny. Here also, a group of weight signal codes (e.g., $W_{1,2}$; $W_{2,2}$; etc.) are inputted to a respective group of multiplying tiny weight DACs to generate a group of scalar multiplication products (e.g., $S_2 \times W_{1,2}$; $S_2 \times W_{2,2}$; etc.).

Respective scalar multiplication product current signals are coupled together to form accumulation current signals (e.g., $Z_1 = S_1 \times W_{1,1} + S_2 \times W_{1,2}$; $Z_2 = S_1 \times W_{2,1} + S_2 \times W_{2,2}$; etc.) in the first layer of neural network of FIG. 2.

The respective accumulation current signals (e.g., $Z_1$, $Z_2$, etc.,) are then summed with their corresponding 'offset bias' current signals (e.g., $B_1$, $B_2$, etc., which can also be programmed with an offset bias current mode DAC). Next, a resultant 'biased accumulation' current signal (e.g., $Z_1 - B_1$, $Z_2 - B_2$, etc.,) is inputted to a corresponding input port of RBNs (e.g., $RBN_{S'1}$, $RBN_{S'2}$, etc.,) of the next layer of current-mode neural network, wherein RBN's input port (e.g., diode connected $P_{S'1}$, $P_{S'2}$, etc.,) can be arranged to perform a ReLu function.

If an accumulation current signal (e.g., $Z_1$, $Z_2$, etc.,) is smaller than its respective offset bias current signal (e.g., $B_1$, $B_2$, etc.,), then the diode connected FET remains off and zero signal is processed through that RBN.

For example, if $Z_1 = S_1 \times W_{1,1} + S_2 \times W_{1,2} < B_1$, then FET $P_{S'1}$ is off, and zero current is passed through $RBN_{S'1}$ and thus zero volt is generated at the 'bias voltage bus' of $RBN_{S'1}$ (e.g., $V_{1S'1} = V_{2S'1} = V_{4S'1} = 0$ etc.) which subsequently bias the reference current network of its corresponding tiny DACs (e.g., $DAC'_{1,1}$; $DAC'_{2,1}$; etc.,) to zero.

Similarly, if $Z_2 = S_1 \times W_{2,1} + S_2 \times W_{2,2} < B_2$, then FET $P_{S'2}$ is off, and zero current is passed through $RBN_{S'2}$ and thus zero volt is generated at the 'bias voltage bus' of $RBN_{S'2}$ (e.g., $V_{1S'2} = V_{2S'2} = V_{4S'2} = 0$ etc.) which subsequently bias the reference current network of its corresponding tiny DACs (e.g., $DAC'_{1,2}$; $DAC'_{2,2}$; etc.,) to zero.

Conversely, if an accumulation current signal (e.g., $Z_1$, $Z_2$, etc.,) is greater than its respective offset bias current signal (e.g., $B_1$, $B_2$, etc.,), then the diode connected RBN's FET (e.g., $P_{S'1}$, $P_{S'1}$, etc.,) conducts a difference signal (e.g., etc.,) which is the 'biased accumulation' current signal.

For example, if $Z_1 = S_1 \times W_{1,1} + S_2 \times W_{1,2} > B_1$, then FET $P_{S'1}$ is on, and $Z_1 - B_1$ or $S_1 \times W_{1,1} + S_2 \times W_{1,2} - B_1$ current is passed through $RBN_{S'1}$ that generates binary weighted currents which in turn program the 'bias voltage bus' which are plurality of reference voltage signals of $RBN_{S'1}$ (e.g., $V_{S'1}$; $V_{2S'1}$; $V_{4S'1}$; etc.) that subsequently bias the reference current network of a group of corresponding multiplying current-mode tiny DACs (e.g., $DAC'_{1,1}$; $DAC'_{2,1}$; etc.,). Similarly, if $Z_2 = S_1 \times W_{2,1} + S_2 \times W_{2,2} > B_2$, then FET $P_{S'2}$ is on, and $Z_2 - B_2$ or $S_1 \times W_{2,1} + S_2 \times W_{2,2} - B_2$ current is passed through $RBN_{S'2}$ that generates binary weighted currents which in turn program the 'bias voltage bus' which are plurality of reference voltage signals of $RBN_{S'2}$ (e.g., $V_{1S'2}$; $V_{2S'2}$; $V_{4S'2}$; etc.) that subsequently bias the reference current network of a group of corresponding multiplying current-mode tiny DACs (e.g., $DAC'_{1,2}$; $DAC'_{2,2}$; etc.,).

Accordingly, $S'_1 = ReLu\{Z_1 - B_1\}$, and $S'_2 = ReLu\{Z_2 - B_2\}$.

Again, notice that intermediate activation signals $S'_1$ and $S'_2$ is not digitalized by ADCs and require no register/memory but instead are inputted as a scalar activation signal in analog current-mode onto the next layer, which saves on silicon area, reduces power consumption and enhances signal processing time.

In the second layer of the fully connected neural network of FIG. 2, a group of weight signal codes (e.g., $W'_{1,1}$; $W'_{2,1}$; and $W'_{1,2}$; $W'_{2,2}$; etc.) are inputted to a respective group of multiplying current-mode tiny weight DACs (e.g., $DAC'_{1,1}$; $DAC'_{2,1}$; and $DAC'_{1,2}$; $DAC'_{2,2}$; etc.,) to generate a group of output current signals that represent a group of scalar multiplication products (e.g., $S'_1 \times W'_{1,1}$; $S'_1 \times W'_{2,1}$, and $S'_2 \times W'_{1,2}$; $S'_2 \times W'_{2,2}$, etc.,).

Coupling the respective scalar multiplication products would generate $Z'_1 = S'_1 \times W'_{1,1} + S'_2 \times W'_{1,2}$, and $Z'_2 = S'_1 \times W'_{2,1} + S'_2 \times W'_{2,2}$ which are offset biased by $B'_1$ and $B'_2$ to generate $S''_1 = ReLu\{Z'_1 - B'_1\}$ and $S''_2 = ReLu\{Z'_2 - B'_2\}$ when inputted to the diode connected input port of the RBN of the next layer of neural network.

It would be obvious to one skilled in the art that other functions such as a normalization DAC to scale and normalize accumulation current signals can be utilized along summing node signal paths, for example. Moreover, it would be obvious to one skilled in the art to improve performance by adding such functions as a current buffer to provide capacitive buffering at summation nodes or arrange ReLu functions with circuits that have a sharper turn on-off edge (instead of single diode connected FET at the input of RBNs, for example) and/or utilizing current clamp circuits to control the maximum amplitude of activation signals at intermediate layers, if required by some applications.

Please refer to this disclosure's introduction section titled DETAILED DESCRIPTION which outlines some of the benefits relevant to the embodiment disclosed in the section above.

Figure 3:
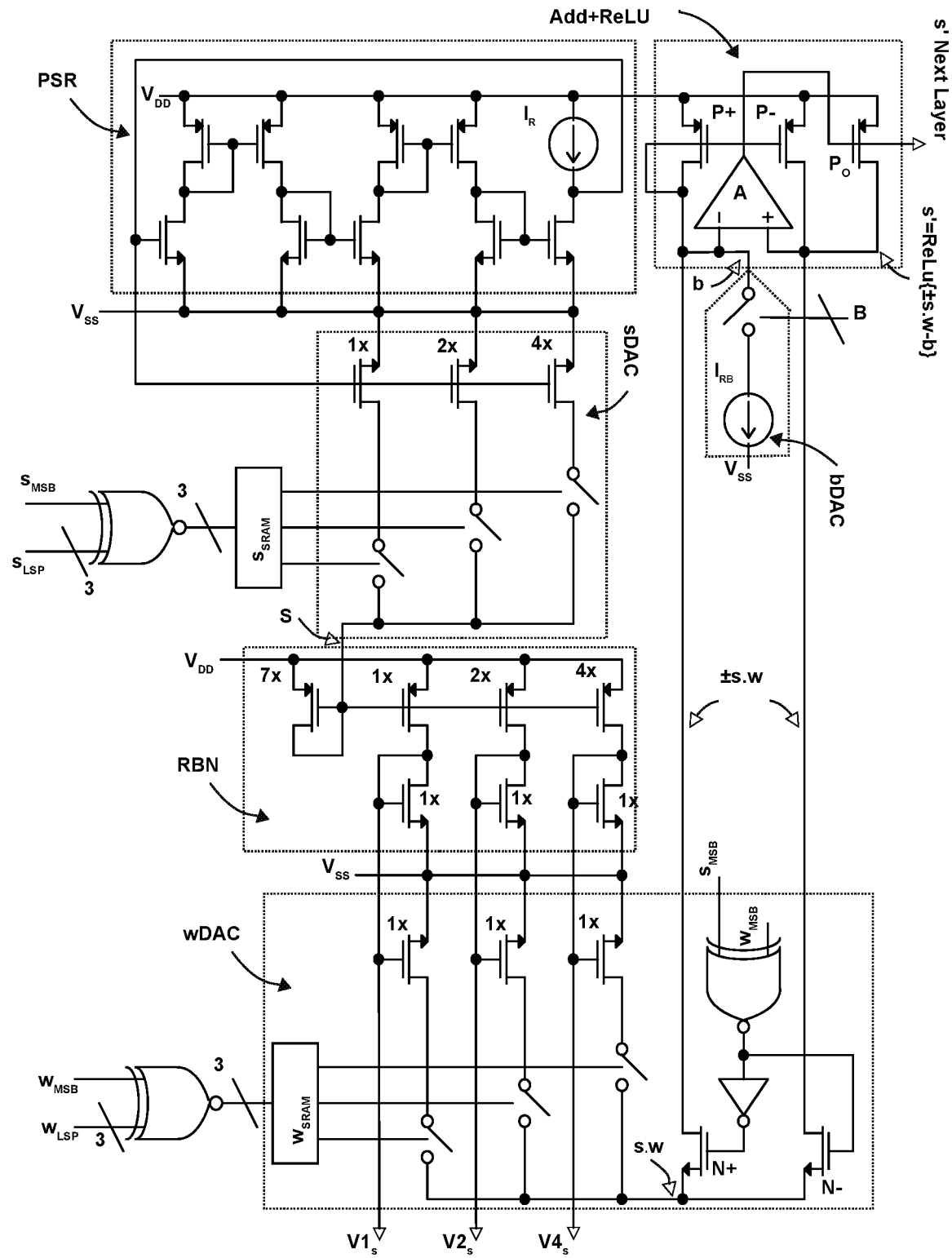
FIG. 3 is a circuit schematic illustrating a simplified embodiment of a scalar multi-quadrant Multiply-Accumulate (iMAC) that can be arranged in neural networks comprising of fully connected layers and in accordance with scalar current-mode mixed-signal fully-connected neural-network method.

Section 3—Description of FIG. 3

FIG. 3 is a circuit schematic illustrating a simplified embodiment of a scalar multi-quadrant Multiply-Accumulate (iMAC) that can be arranged in neural networks comprising of fully connected layers, and in accordance with scalar current-mode mixed-signal fully-connected neural-network method.

The disclosed simplified circuit illustrated in FIG. 3 is comprised of power supply desensitization circuit (PSR), RBN, multiplying DACs, a bias offset DAC, a current mode rectified linear activation function (ReLu), and bipolar summation circuits (Add).

In simplified embodiment illustrated in FIG. 3, an activation signal DAC (sDAC), RBN, and weight signal DAC (wDAC) are arranged with single FET current sources to save on silicon area and speed. To compensate for impact of power supply variations due to the single FET current sources, the PSR circuit receives a reference current ($I_R$) and generates a 'regulated reference signal' that is inputted to the current reference network of sDAC, that is subsequently arranged to flow onto other circuits of FIG. 3.

For clarity of illustration, the sDAC of the simplified embodiment of FIG. 3 generates an output current signal (S) proportional with its 'regulated reference signal' and in accordance with an activation digital signal in form of sign-magnitude 4-bit wide digital word comprised of a MSB sign-bit $S_{MSB}$ and the rest of the bits as a $S_{LSP}$ (Leas-Significant-Portion of the activation word) that program the sDAC.

Note that other digital word formats such as two's complement and other bit-width (e.g., greater than 4-bit wide) can be arranged for activation and weight digital signal words.

Next, the S signal is then inputted onto the RBN circuit which generates a 'bias voltage bus' which are plurality of reference voltage signals comprising $V_{1S}$, $V_{2S}$, and $V_{4S}$. The 'bias voltage bus' which are plurality of reference voltage signals is then supplied onto the wDAC whose output (S×W=s·w) is proportional with the S signal (via the 'bias voltage bus') and in accordance with a weight digital signal also in form of sign-magnitude 4-bit wide digital word comprised of a MSB weight bit $W_{MSB}$ and the rest of the bits as a $W_{LSP}$ (Leas-Significant-Portion of the weight word) that program the wDAC.

Bear in mind that the 'bias voltage bus' which are plurality of reference voltage signals comprising $V_{1S}$, $V_{2S}$, and $V_{4S}$ and representing the S signal (e.g., activation signal as a scalar multiplier) can be shared amongst the reference networks of plurality of weight DACs to perform plurality of scalar multiplications. Such an arrangement can saves on silicon area, improve dynamic response, and improve matching between multiplication products, and be utilized in an arrangement similar to the depiction in the simplified embodiment of FIG. 3 to perform multi-quadrant multiplication.

In accordance with operating an XNOR function on $S_{MSB}$ and $W_{MSB}$, the s·w signal is passed through either a N+ or a N− transistors to generate a multi-quadrant multiplication product current signal (±s·w) which are fed onto a current mirror comprising an amplifier (A), a P+ or a P−, and $P_O$ transistors to facilitate multi-quadrant MAC and ReLu operation, as part of an ADD+ReLu functional block illustrated in the simplified embodiment of FIG. 3.

A bias-offset Digital-to-Analog Converter (bDAC) injects a bias-offset current (b) that is proportional with a bias reference current signal (IRB) and in accordance with a bias digital word signal (B).

If the ±s·w<b, then $P_O$ transistor shuts off and its current signal trends towards zero which is fed onto as an intermediate activation signal of next layer (e.g., S'=0). If the ±s·w>b, then $P_O$ transistor current signal trends towards ±s·w−b, which is then passed onto the next RBN in the next layer of neural network as S'=ReLu{±s·w−b}.

Also keep in mind that for performing a multi-quadrant scalar MAC operation, a plurality of ±s·w signals can share the same Add+ReLu functional block similar to what is depicted in the simplified embodiment of FIG. 3. Accordingly, the addition and subtraction functions (in current mode) for multi-quadrant operations as well as the offset-biasing, and ReLu functions can be performed with one Add+ReLu functional block which saves on silicon die area, and improves matching (in part because one current mirror comprising the amplifier A, and the P+ and P− current mirrors can be shared between plurality of ±s·w signals).

Please also note that intermediate activation signals $S'_1$ does not require being digitalized by an ADC and require no register/memory but instead it can be inputted as a scalar activation signal in analog current-mode onto the RBN of a next layer, which saves on silicon area, reduces power consumption and enhances signal processing time.

A disclosed method herein of programming weight signals (i.e., w) and/or activation signals (i.e., s) and/or their combination can be uniformly distributed by being trained to a specific dynamic range at key summation node (e.g., Gaussian distribution with an average and a sigma) would provide a boundary around MAC signals (i.e., $\Sigma S_1 \cdot W_1$ or $\pm \Sigma S_1 \cdot W_1$) at corresponding summation nodes or through corresponding summation wires. MAC summation signals (at node or through wires) with programmable swings can provide the benefit of lower power consumption and enhanced dynamic performance.

The simplified embodiment in FIG. 3 illustrates an embodiment that can be arranged in accordance with the method of 'programmable statistical distribution' of MAC signals.

FIG. 3 can be arranged with a plurality of multi-quadrant s·w signals that follow a programmable statistical distribution profile (e.g., Gaussian distribution with an average and a sigma), wherein the net MAC summation signal swing flowing onto transistor $P_O$ can follow a profile around the average value of s·w gaussian distribution. Such an arrangement can reduce power consumption and improves speed in light of a limited signal swing through $P_O$ (e.g., signal swing following a ReLu profile with a statistically programmable upper limit, which can also be arranged with a current clamp circuit for a controllable maximum).

Please refer to this disclosure's introduction section titled DETAILED DESCRIPTION which outlines some of the benefits relevant to the embodiment disclosed in the section above.

Figure 4:
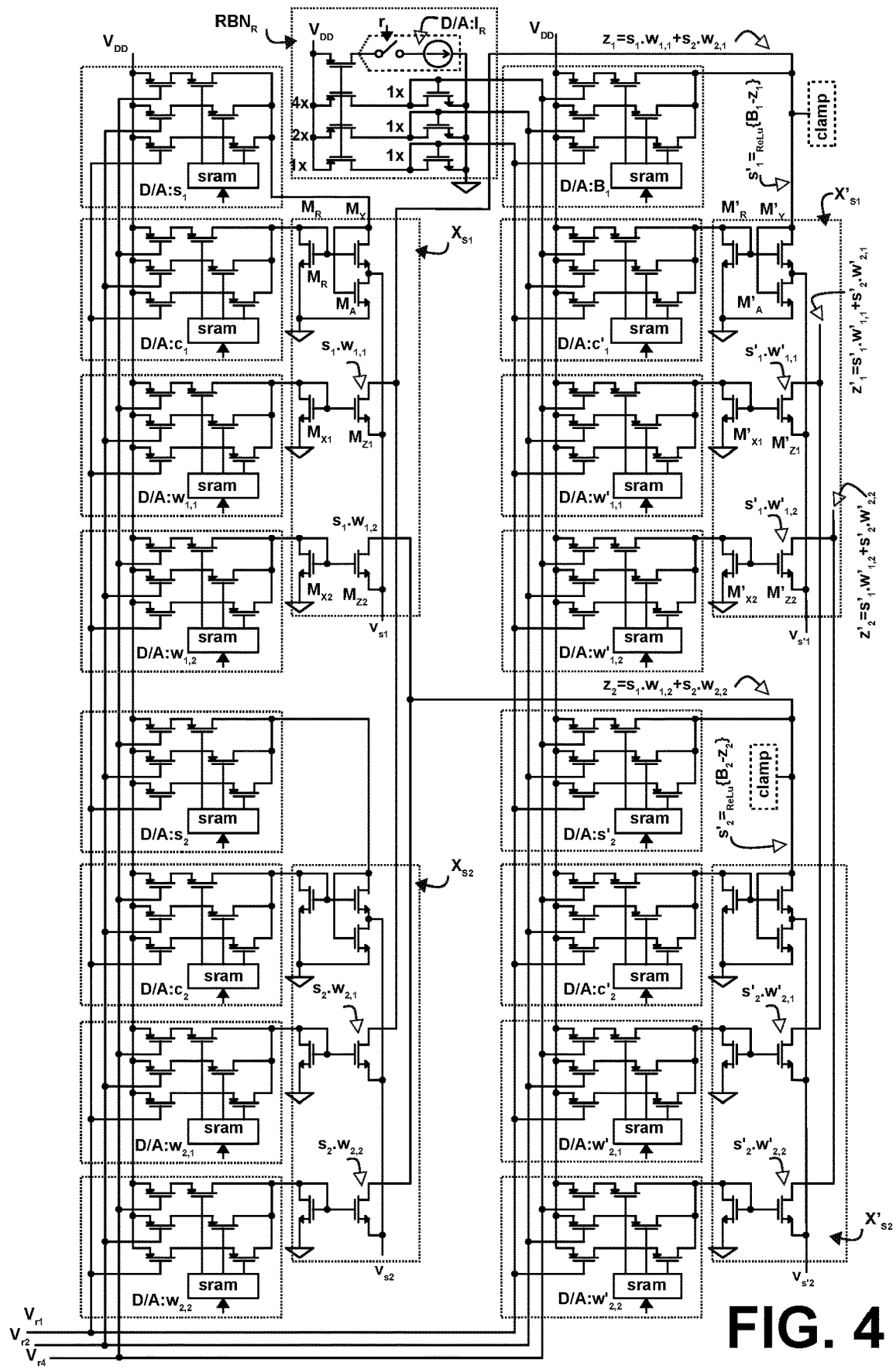
FIG. 4 is a circuit schematic illustrating a simplified embodiment of a current-mode neural network comprising of fully connected layers, arranged with a plurality of scalar subthreshold MOSFET-based multipliers, and in accordance with scalar current-mode mixed-signal fully-connected neural-network method.

Section 4—Description of FIG. 4

FIG. 4 is a circuit schematic illustrating a simplified embodiment of a current-mode neural network comprising of fully connected layers, arranged with an array of scalar subthreshold MOSFET-based multipliers, and in accordance with scalar current-mode mixed-signal fully-connected neural-network method.

Free from intermediate Analog-to-Digital (ADC) and intermediate activation memory and intermediate activation Digital-to-Analog Converter (DAC), the disclosed simplified embodiment of FIG. 4 is arranged with SRAMs (for CIM) for weight inputs and programmable RBN that feed an array of activation and weight data converters whose respective outputs flow onto a plurality of corresponding scalar current-input to current-output subthreshold MOSFET multipliers.

In the simplified neural network embodiment illustrated in FIG. 4, please keep in mind that for clarity of descriptions and illustrations, digital word bit-widths, number of activation and weight signals and number of layers are kept to a few and small scales and proportions, which is not a limitation of the disclosed simplified embodiment and that substantially more and larger scales and proportions can be arranged.

The simplified neural network depiction of FIG. 4 is comprised of the following functional blocks: Activation DACs in the first layer (e.g., D/A: $S_1$, D/A: $S_2$), Weight DACs in the first layer (e.g., D/A: $W_{1,1}$, D/A: $W_{1,2}$ and D/A: $W_{2,1}$, D/A: $W_{2,2}$), Multiplication Reference DACs in the first layer (e.g., D/A: $C_1$, D/A: $C_2$), Bias-Offset DACs between the first and next layer (e.g., D/A: $B_1$, D/A: $B_2$), Weight DACs in the next layer (e.g., D/A: $W'_{1,1}$, D/A: $W'_{1,2}$ and D/A: $W'_{2,1}$, D/A: $W'_{2,2}$), and Multiplication Reference DACs in the next layer (e.g., D/A: $C'_1$, D/A: $C'_2$). A Plurality of scalar current-input to current-output subthreshold MOS-FET multipliers in the first and next layers comprising of $X_{S1}$, $X_{S2}$, $X_{S'1}$, and $X_{S'2}$.

Notice that depending on the end-application requirements, the simplified neural network embodiment of FIG. 4 can be arranged with only one Multiplication Reference DAC (e.g., D/A: $C_1$) wherein for example the gate-source voltage of transistor $M_R$ is shared with other scalar multiplication channels, which saves of silicon die area and improves matching between scalar multiplication products, as opposed to generating independent Multiplication Reference Signals through D/A: $C_2$, D/A: $C'_1$, and D/A: $C'_2$ blocks.

Also, keep in mind that for CIM like operations, SRAMs that store the weight training codes, for example, can be placed on the silicon die right next to Weight, Bias-Offset, and Multiplication Reference DACs which reduces dynamic power consumption associated with digital data write cycles.

A $RBN_R$ generates a 'bias voltage bus' which are plurality of reference voltage signals comprising $V_{R1}$, $V_{R2}$, and $V_{R4}$, wherein $RBN_R$'s operating current is programmed by digital word (r) of an RBN DAC (D/A: $I_R$). Accordingly, the $V_{R1}$, $V_{R2}$, and $V_{R4}$ are shared amongst a plurality of reference network of a plurality of tiny Weight, Activation, Multiplication Reference, and Bias-Offset DACs.

A digital word $S_1$, representing an activation signal (which is also a scalar signal), programs D/A: $S_1$ to generate a scalar current signal that is inputted onto a transistor MY.

A digital word $C_1$, representing a Multiplication Reference Signal, programs D/A: $C_1$ to generate a current signal that is inputted onto diode connected transistor $M_R$.

A digital word $W_{1,1}$, representing a weight signal, programs D/A: $W_{1,1}$ to generate a current signal that is inputted onto a transistor $M_{X1}$.

A digital word $W_{1,2}$, representing a weight signal, programs D/A: $W_{1,2}$ to generate a current signal that is inputted onto a transistor $M_{X2}$.

The transistors $M_{X1}$ and $M_{X2}$ as well as the $M_{Z1}$ and $M_{Z2}$ are parts of a scalar subthreshold MOSFET-based multiplier $X_{S1}$. The $M_R$ and My generate signals which are shared with $M_{X1}$ and $M_{X2}$ as well as $M_{Z1}$ and $M_{Z2}$ to perform a plurality (e.g., pair) of scalar multiplication functions in accordance with the following approximate equations:

Because the FETs in $X_{S1}$ operate under the subthreshold region, and for the loops comprising $M_R$, $M_Y$, $M_A$, $M_{Z1}$, and $M_{X1}$ and $M_R$, $M_Y$, $M_A$, $M_{Z2}$, and $M_{X2}$ the following equations are applicable by the operation of the Kirchhoff Voltage Law (KVL):

$$v_{GS_{M_Y}} + v_{GS_{M_{X1}}} - v_{GS_{M_R}} - v_{GS_{M_{Z1}}} \approx 0.$$

Therefore, $$n \times V_t \times \ln\left[\frac{I_{X1}}{I_R}\right] \approx n \times V_t \times \ln\left[\frac{I_{Z1}}{I_Y}\right],$$

and $I_{Z1} \approx (I_{X1} \times I_Y)/I_R$. Programming $I_R=1$, and substituting for $I_{X1}=w_{1,1}$ and $I_Y=s_1$, then scalar multiplication product $I_{Z1} \approx w_{1,1} \times s_1$ is generated.

Similarly, $$v_{GS_{M_Y}} + v_{GS_{M_{X2}}} - v_{GS_{M_R}} - v_{GS_{M_{Z2}}} \approx 0.$$

Therefore, $$n \times V_t \times \ln\left[\frac{I_{X2}}{I_R}\right] \approx n \times V_t \times \ln\left[\frac{I_{Z2}}{I_Y}\right],$$

and $I_{Z2} \approx (I_{X2} \times I_Y)/I_R$. Programming $I_R=1$, and substituting for $I_{X2}=w_{1,2}$ and $I_Y=s_1$, then scalar multiplication product $I_{Z2} \approx w_{1,2} \times s_1$ is generated.

Keep in mind that transistor $M_A$ functions like an inverting amplifier to regulate and supply the needed current to node $V_{S1}$ for KVL to hold. Also, notice that only one voltage node (e.g., one wire carrying $V_{S1}$) is shared with plurality of Weight (e.g., $M_{X1}$, $M_{X2}$) FETs and plurality of Multiplication Product (e.g., $M_{Z1}$, $M_{Z2}$) FETs in the scalar subthreshold MOSFET-based multiplier of FIG. 4. The $V_{S1}$ signal represents a voltage difference $Vgs_{MY}$ and $Vgs_{MR}$ which also represents a signal (e.g., current to voltage) difference between scalar/activation signal and reference multiplication signal that is shared amongst parts of scalar multiplier channels.

Note that at the expense of extra circuitry and current consumption, independent multiplication reference signals can be programmed to perform batch normalization for plurality of MACs (e.g., programming $I_R$ to different values in $I_Z \approx (I_X \times I_Y)/I_R$ for group of multipliers).

In the simplified neural network embodiment of FIG. 4, scalar multiplication products $w_{2,1} \times s_2$ and $w_{2,2} \times s_2$ are generated by applying similar equations to that of the above for scalar subthreshold MOSFET-based multiplier $X_{S2}$.

The functions of accumulating the multiplication products (i.e., MAC) are performed around $X_{S1}$ and $X_{S2}$ to respectively generate $Z_1 = w_{1,1} \times s_1 + w_{2,1} \times s_2$ and $Z_2 = w_{1,2} \times s_1 + w_{2,2} \times s_2$, by coupling wires that carry the current signals $w_{1,1} \times s_1$ and $w_{2,1} \times s_2$ and by coupling the wires that carry the current signals $w_{1,2} \times s_1$ and $w_{2,2} \times s_2$, respectively.

Next, a digital word $B_1$, representing a biasing-offset signal, programs D/A: $B_1$ to generate a current signal that is summed with $Z_1$.

A digital word $B_2$, representing a biasing-offset signal, programs D/A: $B_2$ to generate a current signal that is summed with $Z_2$.

As such, the first layer of neural network generates an intermediate activation analog current signal $S'_1 = Z_1 - B_1 = w_{1,1} w_{2,1} \times s_2 - B_1$ that is inputted to a next layer of neural network's scalar subthreshold MOSFET-based multiplier $X_{S'1}$.

Similarly, the first layer of neural network generates an intermediate activation analog current signal $S'_2 = Z_2 - B_2 = w_{1,2} \times s_1 + w_{2,2} \times s_2 - B_2$ that is inputted to a next layer of neural network's scalar subthreshold MOSFET-based multiplier $X_{S'2}$.

Please notice the following arrangements in the next layer, similar to the first layer of the simplified neural network embodiment of FIG. 4:

The $S'_1$ intermediate activation analog current signal is inputted into transistor M'Y of scalar multiplier $X_{S'1}$. Please notice that in the simplified embodiment of FIG. 4, the $S'_1$ neither needs to be digitized by an intermediate ADC, nor it requires any intermediate activation memory or register, nor any subsequent intermediate activation DAC is required, which saves on silicon die area, lower current consumption, and enhances signal processing time.

In the simplified neural network of FIG. 4, this is an example of how a ReLu function (around a scalar multiplier) is performed upon an intermediate activation current signal inputted to a next layer: when $S'_1<0$ (or when $B_1<Z_1$), then $M'_A$ is off and the current through $M'_A$ is zero. Conversely, when $S'_1>0$ (or when $B_1>Z_1$), then $M'_A$ is on and the current through $M'_A$ is $B_1-Z_1$. Keep in mind that in the simplified embodiment of FIG. 4, same description applies to other intermediate activation signals (e.g., $S'_2$).

Next, a digital word $C'_1$ representing a Multiplication Reference Signal, programs D/A: $C'_1$ to generate a current signal that is inputted onto diode connected transistor M'R of scalar multiplier $X_{S'1}$.

A digital word $W'_{1,1}$ representing a weight signal, programs D/A: $W'_{1,1}$ to generate a current signal that is inputted onto a transistor $M'_{X1}$ of scalar multiplier $X_{S'1}$.

A digital word $W'_{1,2}$ representing a weight signal, programs D/A: $W'_{1,2}$ to generate a current signal that is inputted onto a transistor $M'_{X2}$ of scalar multiplier $X_{S'1}$.

In the simplified neural network embodiment of FIG. 4, the following scalar multiplication products are generated: $I_{Z'1} \approx w'_{1,1} \times s'_1$ and $I_{Z'2} \approx w'_{1,2} \times s'_1$ by applying similar equations for $X_{S'1}$ in the next layer (to that of equations pertaining to the $X_{S1}$ of the prior layer).

Likewise, the $S'_2$ intermediate activation analog current signal is fed onto scalar multiplier $X_{S'2}$.

A digital word $C'_2$ representing a Multiplication Reference Signal, programs D/A: $C'_2$ to generate a current signal that is fed onto scalar multiplier $X_{S'2}$.

A digital word $W'_{2,1}$ representing a weight signal, programs D/A: $W'_{2,1}$ to generate a current signal that is fed onto scalar multiplier $X_{S'2}$.

A digital word $W'_{2,2}$ representing a weight signal, programs D/A: $W'_{2,2}$ to generate a current signal that is fed onto scalar multiplier $X_{S'2}$.

Therefore, the following scalar multiplication products $W_{2,1} \times s'_2$ and $w_{2,2} \times s'_2$ are generated by applying similar equations for $X_{S'2}$ in the next layer (to that of equations pertaining to the $X_{S2}$ of the first layer).

A $w'_{1,1} \times s'_1 + w^{2,1} \times s'_2 = Z'_1$ current signal is generated, representing the accumulation of a group (e.g., a couple) of scalar multiplication products (for communications with a subsequent layer of the neural network) by coupling the wire carrying the $w'_{1,1} \times s'_1$ current signal with the wire carrying $w'_{2,1} \times s'_2$.

A $W_{1,2} \times s'_1 + w_{2,2} \times s'_2 = Z'_2$ current signal is generated, representing the accumulation of a group (e.g., a couple) of scalar multiplication products (for communications with the subsequent layer of the neural network) by coupling the wire carrying the $W_{1,2} \times s'_1$ current signal with the wire carrying $w'_{2,2} \times s'_2$.

Please refer to this disclosure's introduction section titled DETAILED DESCRIPTION which outlines some of the benefits relevant to the embodiment disclosed in the section above.

Figure 5:
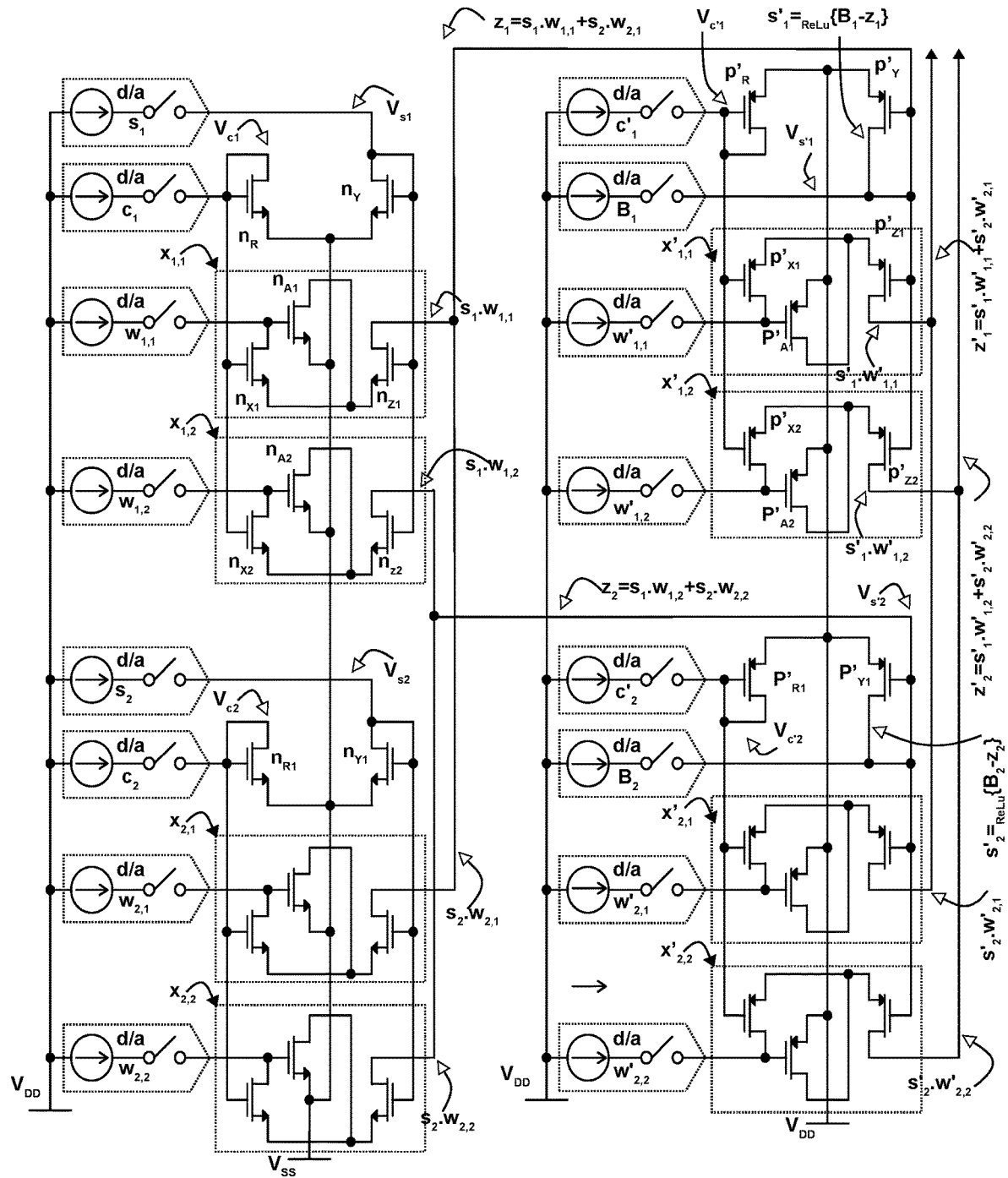
FIG. 5 is a circuit schematic illustrating a simplified embodiment of a current-mode neural network comprising of fully connected layers, arranged with a plurality of scalar subthreshold MOSFET-based multipliers, and in accordance with scalar current-mode mixed-signal fully-connected neural-network method.

Section 5—Description of FIG. 5

FIG. 5 is a circuit schematic illustrating a simplified embodiment of a current-mode neural network comprising of fully connected layers, arranged with an array of scalar subthreshold MOSFET-based multipliers, and in accordance with scalar current-mode mixed-signal fully-connected neural-network method.

Also, free from intermediate Analog-to-Digital (ADC) and intermediate activation memory and intermediate activation Digital-to-Analog Converter (iDAC), the disclosed simplified embodiment of FIG. 5 can be arranged with SRAMs (not shown for clarity of illustrations) for CIM operations to store weight, biasing offset, and reference multiplication digital word signals. The embodiment of FIG. 5 can also be arranged with a programmable RBN (not shown for clarity of illustrations) that feed an array of activation and weight data converters whose output provide the input signals to a plurality of scalar current-input to current-output subthreshold MOSFET multipliers.

In the simplified neural network embodiment illustrated in FIG. 5, please keep in mind that for clarity of descriptions and illustrations, digital word bit-widths, number of activation and weight signals and number of layers are kept to a few and small scales and proportions, which is not a limitation of the disclosed simplified embodiment and that substantially more and larger scales and proportions can be arranged.

The simplified neural network depiction of FIG. 5 is comprised of the following functional blocks: Activation DACs in the first layer (e.g., d/a: $S_1$, d/a: $S_2$), Weight DACs in the first layer (e.g., d/a: $W_{1,1}$, d/a: $W_{1,2}$ and d/a: $W_{2,1}$, d/a: $W_{2,2}$), Multiplication Reference DACs in the first layer (e.g., d/a: $C_1$, d/a: $C_2$), Bias-Offset DACs between the first and next layer (e.g., d/a: $B_1$, d/a: $B_2$), Weight DACs in the next layer (e.g., d/a: $W'_{1,1}$, d/a: $W'_{1,2}$ and d/a: $W'_{2,1}$, d/a: $W'_{2,2}$), and Multiplication Reference DACs in the next layer (e.g., d/a: $C'_1$, d/a: $C'_2$). A plurality of scalar current-input to current-output subthreshold MOSFET multipliers in the first and next layers comprising of: $N_R-N_Y$ & $X_{1,1}-X_{1,2}$; $N_{R1}-N_{Y1}$ & $X_{2,1}-X_{2,2}$; $P'_R-P'_Y$ & $X'_{1,1}-X'_{1,2}$; and $P'_{R1}-P'_{Y1}$ & $X'_{2,1}-X'_{2,2}$.

Notice that depending on the end-application requirements, the simplified neural network embodiment of FIG. 5 can be arranged with only one Multiplication Reference DAC (e.g., d/a: $C_1$) wherein for example the gate-source voltage of transistor $N_R$ is shared amongst plurality of subthreshold MOSFET multipliers, which saves of silicon die area and improves matching between scalar multiplication products, as opposed to generating independent Multiplication Reference Signals through d/a: $C_2$, d/a: $C'_1$, and d/a: $C'_2$ blocks.

Also, keep in mind that for CIM like operations, SRAMs (not shown for clarity of illustration) that store the weight training codes, for example, can be placed on the silicon die right next to Weight, Bias-Offset, and Multiplication Reference DACs which reduces dynamic power consumption associated with digital data write cycles.

A $RBN_R$ (not shown for clarity of illustration) can be arranged to generates a 'bias voltage bus' which are plurality of reference voltage signals that for example can be shared amongst a plurality of reference network of a plurality of tiny Weight, Activation, Multiplication Reference, and Bias-Offset DACs.

A digital word $S_1$, representing an activation signal (which is also a scalar signal), programs d/a: $S_1$ to generate a scalar current signal that is inputted onto a transistor $N_Y$, and generating a voltage signal $V_{S1}$.

A digital word $C_1$, representing a Multiplication Reference Signal, programs d/a: $C_1$ to generate a current signal that is inputted onto diode connected transistor $N_R$, and generating a voltage signal $V_{C1}$.

A digital word $W_{1,1}$, representing a weight signal, programs d/a: $W_{1,1}$ to generate a current signal that is inputted onto a transistor $N_{X1}$ whose gate port is coupled with $V_{C1}$.

A digital word $W_{1,2}$, representing a weight signal, programs d/a: $W_{1,2}$ to generate a current signal that is inputted onto a transistor $N_{X2}$ whose gate port is also coupled with $V_{C1}$.

Gate ports of transistors $N_{Z1}$ and $N_{Z2}$ are coupled with $V_{S1}$.

The transistors $N_{X1}$ and $N_{X2}$ as well as the $N_{Z1}$ and $N_{Z2}$ are parts of a scalar subthreshold MOSFET-based multiplier $X_{1,1}$ and $X_{1,2}$ As noted earlier, the $N_R$ and $N_Y$ transistors generate gate voltage signals which are respectively coupled to gate ports of $N_{X1}$-$N_{X2}$, and $N_{Z1}$-$N_{Z2}$ to perform a plurality (e.g., pair) of scalar multiplication functions in accordance with the following approximate equations:

Because the FETs operate under the subthreshold region, and for the loops comprising $N_R$, $N_Y$, $N_{A1}$, $N_{Z1}$, and $M_{X1}$ and $N_R$, $N_Y$, $N_{A2}$, $N_{Z2}$, and $N_{X2}$ the following equations are applicable by the operation of the Kirchhoff Voltage Law (KVL):

$$v_{GS_{N_Y}} + v_{GS_{N_{X1}}} - v_{GS_{N_R}} - v_{GS_{N_{Z1}}} \approx 0.$$

Therefore, $$n \times V_t \times \ln\left[\frac{I_{X1}}{I_R}\right] \approx n \times V_t \times \ln\left[\frac{I_{Z1}}{I_Y}\right],$$

and $I_{Z1} \approx (I_{X1} \times I_Y)/I_R$. Programming $I_R = 1$, and substituting for $I_{X1} = w_{1,1}$ and $I_Y = s_1$, then scalar multiplication product $I_{Z1} \approx w_{1,1} \times s$ is generated.

Similarly, $$v_{GS_{N_Y}} + v_{GS_{N_{X2}}} - v_{GS_{N_R}} - v_{GS_{N_{Z2}}} \approx 0.$$

Therefore, $$n \times V_t \times \ln\left[\frac{I_{X2}}{I_R}\right] \approx n \times V_t \times \ln\left[\frac{I_{Z2}}{I_Y}\right],$$

and $I_{Z2} \approx (I_{X2} \times I_Y)/I_R$. Programming $I_R = 1$, and substituting for $I_{X2} = w_{1,2}$ and $I_Y = s_1$, then scalar multiplication product $I_{Z2} \approx w_{1,2} \times s_1$ is generated.

Note that at the expense of extra circuitry and current consumption, independent multiplication reference signals can be programmed to perform batch normalization for plurality of MACs (e.g., programming $I_R$ to different values in $I_Z \approx (I_X \times I_Y)/I_R$ for group of multipliers).

Keep in mind that for KVL to hold, transistor $N_{A1}$ and $N_{A2}$ functions like an inverting amplifier to regulate and supply the needed current to $N_{X1}$-$N_{Z1}$ and $N_{X2}$-$N_{Z2}$, respectively. Also, notice that two voltage nodes (e.g., two wires carrying $V_{C1}$ and $V_{S1}$) are shared with plurality of Weight (e.g., $N_{X1}$, $N_{X2}$) FETs and plurality of Multiplication Product (e.g., $N_{Z1}$, $N_{Z2}$) FETs in the scalar subthreshold MOSFET-based multipliers of FIG. 5 comprising $N_R$, $N_Y$, $X_{1,1}$, and $X_{1,2}$.

In the simplified neural network embodiment of FIG. 5, scalar multiplication products $w_{2,1} \times s_2$ and $w_{2,2} \times s_2$ are generated by applying similar equations to that of the above for parts of a scalar subthreshold MOSFET-based multipliers $X_{2,1}$ and $X_{2,2}$, which are fed with voltages $V_{C2}$, and $V_{S2}$.

The functions of accumulating the multiplication products (i.e., MAC) are performed via feeding $V_{C1}$-$V_{S1}$ onto $X_{1,1}$-$X_{1,2}$ and feeding $V_{C2}$-$V_{S2}$ onto $X_{2,1}$-$X_{2,2}$ to respectively generate $Z_1 = w_{1,1} \times s_1 + w_{2,1} \times s_2$ and $Z_2 = w_{1,2} \times s_1 + w_{2,2} \times s_2$, by coupling wires that carry the current signals $w_{1,1} \times s_1$ and $w_{2,1} \times s_2$ and by coupling the wires that carry the current signals $w_{1,2} \times s_1$ and $w_{2,2} \times s_2$, respectively.

Next, a digital word $B_1$, representing a biasing-offset signal, programs d/a: $B_1$ to generate a current signal that is summed with $Z_1$.

A digital word $B_2$, representing a biasing-offset signal, programs d/a: $B_2$ to generate a current signal that is summed with $Z_2$.

As such, the first layer of neural network generates an intermediate activation analog current signal $S'_1 = Z_1 - B_1 = w_{1,1} \times s_1 + w_{2,1} \times s_2 - B_1$ that is inputted to a next layer of neural network's scalar subthreshold MOSFET-based multiplier.

In the simplified neural network of FIG. 5, this is an example of how a ReLu function (around a scalar multiplier) is performed upon an intermediate scalar/activation current signal inputted to a next layer: when $S'_1 < 0$ (i.e., $Z_1 < B_1$), then transistor $P'_Y$ turns off and the current (e.g., intermediate activation signal which is also an intermediate scalar signal) is zero. Conversely, when $S'_1 > 0$ (i.e., $Z_1 > B_1$), then transistor $P'_Y$ turns on and the current (intermediate activation scalar signal) is $Z_1 - B_1$. Keep in mind that in the simplified embodiment of FIG. 5, same description applies to other intermediate activation signals (e.g., $S'_2$).

Similarly, the first layer of neural network generates an intermediate activation analog current signal $S'_2 = Z_2 - B_2 = w_{1,2} \times s_1 + w_{2,2} \times s_2 - B_2$ that is inputted to a next layer of neural network's scalar subthreshold MOSFET-based multiplier.

The description of arrangements in the next layer is similar to the first layer of the simplified neural network embodiment of FIG. 5:

The $S'_1$ intermediate activation analog current signal is inputted into a p-channel transistor $P'_Y$, which generates a gate voltage of $V_{S'1}$. Please notice that in the simplified embodiment of FIG. 5, the $S'_1$ neither needs to be digitized by an intermediate ADC, nor it requires any intermediate activation memory or register, nor any subsequent intermediate activation DAC is required, which saves on silicon die area, lowers current consumption, and enhances signal processing time.

Next, a digital word $C'_1$ representing a Multiplication Reference Signal, programs d/a: $C'_1$ to generate a current signal that is inputted onto diode connected transistor $P'_R$, which generates a gate voltage of $V_{C'1}$.

A digital word $W'_{1,1}$ representing a weight signal, programs d/a: $W'_{1,1}$ to generate a current signal that is inputted onto a transistor $P'_{X1}$ (of $X'_{1,1}$) whose gate port is coupled with $V_{C'1}$.

A digital word $W'_{1,2}$ representing a weight signal, programs d/a: $W'_{1,2}$ to generate a current signal that is inputted onto a transistor $P'_{X2}$ (of $X'_{1,1}$) whose gate port is also coupled with $V_{C'1}$.

In the simplified neural network embodiment of FIG. 5, the following scalar multiplication products $I_{Z'1} \approx w'_{1,1} \times s'_1$ and $I_{Z'2} \approx w'_{1,2} \times s'_1$ are generated by applying similar equations to that of the above for parts of a scalar subthreshold MOSFET-based multipliers $X'_{1,1}$ and $X'_{1,2}$, which are fed with voltages $V_{C'1}$, and $V_{S'1}$ (where diode connected transistor TY is fed with current signal $S'_1=Z_1-B_1$).

Likewise, the $S'_2$ intermediate activation analog current signal is fed onto a diode connected transistor $N_{Y'1}$ of a scalar multiplier that generates $V_{S'2}$.

A digital word $C'_2$ representing a Multiplication Reference Signal, programs d/a: $C'_2$ to generate a current signal that is fed onto a diode connected transistor $N_{R'1}$ of a scalar multiplier that generates $V_{C'2}$.

A digital word $W'_{2,1}$ representing a weight signal, programs d/a: $W'_{2,1}$ to generate a current signal that is fed onto $X'_{2,1}$.

A digital word $W'_{2,2}$ representing a weight signal, programs d/a: $W'_{2,2}$ to generate a current signal that is fed onto $X'_{2,2}$.

In the simplified neural network embodiment of FIG. 5, scalar multiplication products $w'_{2,1} \times s'_2$ and $w_{2,2} \times s'_2$ are generated by applying similar equations to that of the above for parts of a scalar subthreshold MOSFET-based multipliers $X'_{2,1}$ and $X'_{2,2}$, which are fed with voltages $V_{C'2}$, and $V_{S'2}$.

A $w'_{1,1} \times s'_1 + w'_{2,1} \times s'_2 = Z'_1$ current signal is generated, representing the accumulation of a group (e.g., a couple) of scalar multiplication products (for communications with a subsequent layer of the neural network) by coupling the wire carrying the $w'_{1,1} \times s'_1$ current signal with the wire carrying $w'_{2,1} \times s'_2$.

A $w_{1,2} \times s'_1 + w'_{2,2} \times s'_2 = Z'_2$ current signal is generated, representing the accumulation of a group (e.g., a couple) of scalar multiplication products (for communications with the subsequent layer of the neural network) by coupling the wire carrying the $w'_{1,2} \times s'_1$ current signal with the wire carrying $w'_{2,2} \times s'_2$.

Please refer to this disclosure's introduction section titled DETAILED DESCRIPTION which outlines some of the benefits relevant to the embodiment disclosed in the section above.

Figure 6:
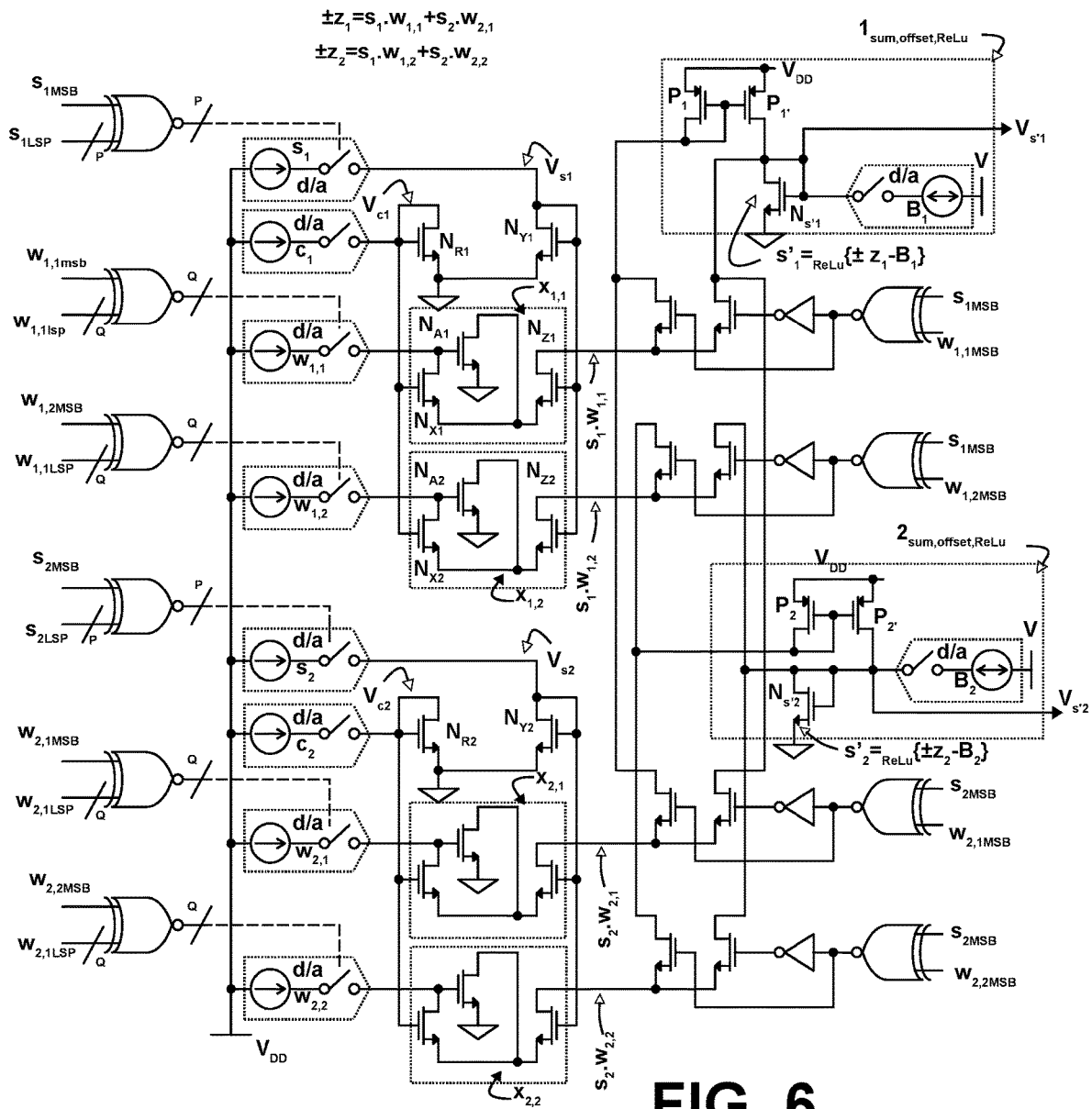
FIG. 6 is a circuit schematic illustrating a simplified embodiment of a multi-quadrant iMAC arranged with a plurality of scalar subthreshold MOSFET-based multipliers that can be arranged in current-mode neural networks comprising of fully connected layers, and in accordance with scalar current-mode mixed-signal fully-connected neural-network method.

Section 6—Description of FIG. 6

FIG. 6 is a circuit schematic illustrating a simplified embodiment of a multi-quadrant iMAC arranged with an array of scalar subthreshold MOSFET-based multipliers that can be arranged in current-mode neural networks comprising of fully connected layers, and in accordance with scalar current-mode mixed-signal fully-connected neural-network method.

The disclosed simplified embodiment of FIG. 6 can be arranged with SRAMs (not shown for clarity of illustration) for CIM and programmable RBN (not shown for clarity of illustration) that can feed an array of activation and weight data-converters (DACs) whose output provide the input signals to a plurality of scalar current-input to current-output subthreshold MOSFET multipliers. The multi-quadrant outputs of the array of scalar subthreshold MOSFET multipliers here are supplied to sum-offset-ReLu circuits before they are passed onto subsequent neurons of next layer.

The neural network depiction of FIG. 6 is comprising of the following functional blocks: Activation DACs in the first layer (e.g., d/a: $S_1$, d/a: $S_2$), Weight DACs in the first layer (e.g., d/a: $W_{1,1}$, d/a: $W_{1,2}$ and d/a: $W_{2,1}$, d/a: $W_{2,2}$), Multiplication Reference DACs in the first layer (e.g., d/a: $C_1$, d/a: $C_2$), Bias-Offset DACs between the first and next layer (e.g., d/a: $B_1$, d/a: $B_2$), a plurality scalar current-input to current-output subthreshold MOSFET multipliers in the first layer are comprising: $N_{R1}$-$N_{Y1}$ & $X_{1,1}$-$X_{1,2}$; $N_{R2}$-$N_{Y2}$ & $X_{2,1}$-$X_{2,2}$;

A number of XNOR gates to receive the sign-magnitude weight and activation codes; and circuits that perform the current summation of multi-quadrant MAC signals and bias-offset signals, and ReLu functions (e.g., $1_{SUM,OFFSET,ReLU}$, and $2_{SUM,OFFSET,ReLU}$).

Keep in mind that depending on the end-application requirements, the simplified neural network embodiment of FIG. 6 can be arranged with only one Multiplication Reference DAC (e.g., d/a: $C_1$) wherein for example the gate-source voltage of transistor $N_{R1}$ is shared amongst corresponding ports of plurality of subthreshold MOSFET multipliers, which saves silicon die area and improves matching between scalar multiplication products.

Also, keep in mind that for CIM like operations, SRAMs (not shown for clarity of illustration) that for example store the weight training, bias-offset, reference multiplication codes can be placed on the silicon die right next to Weight (e.g., d/a: $w_{1,1}$), Bias-Offset (e.g., da/a: $B_1$), and Multiplication Reference (e.g., d/a: $C_1$) DACs which can reduce dynamic power consumption associated with digital data communication cycles.

A $RBN_R$ (not shown for clarity of illustration) can be arranged to generates a 'bias voltage bus' which are plurality of reference voltage signals that for example can be shared amongst a plurality of reference network of a plurality of tiny Weight, Activation, Multiplication Reference, and Bias-Offset DACs.

Notice in the embodiment illustrated in FIG. 6 that for multi-quadrant operations, sign-magnitude weight and activation codes are processed through XNOR gates and onto respective activations and weight DACs. Here, MSB sign-bit of an activation code is $S_{MSB}$ and the rest of the bits are $S_{LSP}$ as Leas-Significant-Portion of the activation code. Moreover, MSB sign-bit of a weight code is $Wi_{MSB}$ and the rest of the bits are $Wi_{LSP}$ as Leas-Significant-Portion of the corresponding weight code. Moreover, note that other digital word formats such as two's complement can be arranged for activation and weight digital signal words.

A code $S_1$, representing an activation signal (which is also a scalar signal), programs d/a: $S_1$ and in accordance with XNOR operations (e.g., $S_{1MSB}$ is a sign-bit, and $S_{1LSP}$ is P-bit wide) to generate a scalar current signal that is inputted onto a transistor $N_{Y1}$, and generating a voltage signal $V_{S1}$.

A digital word $C_1$, representing a Multiplication Reference Signal, programs d/a: $C_1$ to generate a current signal that is inputted onto diode connected transistor $N_{R1}$, and generating a voltage signal $V_{C1}$.

A code $W_{1,1}$ representing a weight signal programs d/a: $W_{1,1}$, and in accordance with XNOR operations (e.g., $W_{1,1MSB}$ is a sign-bit, and $W_{1,1LSP}$ is Q-bit wide) to generate a current signal that is inputted onto a transistor $N_{X1}$ whose gate port is coupled with $V_{C1}$.

A digital word $W_{1,2}$, representing a weight signal, and in accordance with XNOR operations, programs d/a: $W_{1,2}$ to generate a current signal that is inputted onto a transistor $N_{X2}$ whose gate port is also coupled with $V_{C1}$.

Gate ports of transistors $N_{Z1}$ and $N_{Z2}$ are coupled with $V_{S1}$.

Transistors $N_{X1}$ and $N_{X2}$ as well as the $N_{Z1}$ and $N_{Z2}$ are parts of a scalar subthreshold MOSFET-based multiplier comprising $X_{1,1}$ and $X_{1,2}$ blocks. As noted earlier, the $N_{R1}$ and $N_{Y1}$ diode connected transistors generate gate voltage signals which are respectively coupled to gate ports of $N_{X1}$-$N_{X2}$, and $N_{Z1}$-$N_{Z2}$ to perform a plurality (e.g., pair) of scalar multiplication functions in accordance with the following approximate equations:

Because the FETs operate under the subthreshold region, and for the loops comprising $N_{R1}$, $N_{Y1}$, $N_{A1}$, $N_{Z1}$, and $M_{X1}$ and $N_{R1}$, $N_{Y1}$, $N_{A2}$, $N_{Z2}$, and $N_{X2}$ the following equations are applicable by the operation of the Kirchhoff Voltage Law (KVL):

$$v_{GS_{N_{Y1}}} + v_{GS_{N_{X1}}} - v_{GS_{N_{R1}}} - v_{GS_{N_{Z1}}} \approx 0.$$

Therefore, $$n \times V_t \times \ln\left[\frac{I_{X1}}{I_{R1}}\right] \approx n \times V_t \times \ln\left[\frac{I_{Z1}}{I_{Y1}}\right],$$

and $I_{Z1} \approx (I_{X1} \times I_{Y1})/I_{R1}$. Programming $I_{R1}=1$, and substituting for $I_{X1}=w_{1,1}$ and $=s_1$, then scalar multiplication product $I_{Z1} \approx w_{1,1} \times s_1$ is generated.

Similarly, $$n \times V_t \times \ln\left[\frac{I_{X2}}{I_{R1}}\right] \approx n \times V_t \times \ln\left[\frac{I_{Z2}}{I_{Y1}}\right],$$

Therefore, $$v_{GS_{N_{Y1}}} + v_{GS_{N_{X2}}} - v_{GS_{N_{R1}}} - v_{GS_{N_{Z2}}} \approx 0.$$

and $I_{Z2} \approx (I_{X2} \times I_{Y1})/I_{R1}$. Programming $I_{R1}=1$, and substituting for $I_{X2}=w_{1,2}$ and $I_{Y1}=s_1$, then scalar multiplication product $I_{Z2} \approx w_{1,2} \times s_1$ is generated.

Note that at the expense of extra circuitry and current consumption, independent multiplication reference signals can be programmed to perform batch normalization for plurality of MACs (e.g., programming $I_R$ to different values in $I_Z \approx (I_X \times I_Y)/I_R$ for group of multipliers).

Keep in mind that for KVL to hold, transistor $N_{A1}$ and $N_{A2}$ function as an inverting amplifier to regulate and supply the needed current to $N_{X1}$-$N_{Z1}$ transistors and $N_{X2}$-$N_{Z2}$ transistors, respectively. Also, notice that two voltage nodes (e.g., two wires carrying $V_{C1}$ and $V_{S1}$) are shared with plurality of Weight transistors (e.g., $N_{X1}$, $N_{X2}$) and plurality of Multiplication Product transistors (e.g., $N_{Z1}$, $N_{Z2}$) in scalar subthreshold MOSFET-based multipliers of FIG. 6 comprising $N_{R1}$, $N_{Y1}$, $X_{1,1}$, and $X_{1,2}$.

In the simplified neural network embodiment of FIG. 6, scalar multiplication products $w_{2,1} \times s_2$ and $w_{2,2} \times s_2$ are generated by applying similar equations to that of the above for parts of a scalar subthreshold MOSFET-based multipliers $X_{2,1}$ and $X_{2,2}$, which are fed with voltages $V_{C2}$, and $V_{S2}$ from diode connected transistors $N_{R2}$ and $N_{Y2}$.

For multi-quadrant operations, the respective multiplication products $w_{1,1} \times s_1$, $w_{1,2} \times s_1$, $w_{2,1} \times s_2$, and $w_{2,2} \times s_2$ are each fed onto corresponding 'differential switches' that are gated by XNOR operations in accordance with respective (sign-bit) MSB of weight and activation codes.

To generate multi-quadrant $\pm Z_1 = w_{1,1} \times s_1 + w_{2,1} \times s_2$ and multi-quadrant $\pm Z_2 = w_{1,2} \times s_1 + w_{2,2} \times s_2$, the output of the corresponding 'differential switches' are respectively summed together and with the corresponding offset-bias current signals (e.g., d/a: B1 and d/a: B2) and coupled to current mirrors (e.g., $P_1$, $P_{1'}$ and $P_2$, $P_{2'}$) which are part of the $1_{SUM,OFFSET,ReLU}$, and $1_{SUM,OFFSET,ReLU}$ circuits.

The ReLu function for $S'_1 = \text{ReLu}\{\pm Z_1 - B_1\}$ is performed as follows: When $\pm Z_1 < B_1$, then diode connected transistor $N_{S'1}$ turns off and the current signal through $N_{S'1}$ is zero (voltage $V_{S'1}$ that is applied to next layer's scalar subthreshold MOSFET multiplier is zero), otherwise diode connected transistor $N_{S'1}$ turns on and the current through $N_{S'1}$ is $\pm Z_1 - B_1$ which corresponds to a value of $V_{S'1}$ as an intermediate activation scalar signal that is inputted to next layer's scalar subthreshold MOSFET multiplier.

Similarly, the ReLu function for $S'_2 = \text{ReLu}\{\pm Z_2 - B_2\}$ is performed as follows: When $\pm Z_2 < B_2$, then diode connected transistor $N_{S'1}$ turns off and the current signal through it is zero (voltage $V_{S'1}$ that is applied to next layer's scalar subthreshold MOSFET multiplier is zero), otherwise diode connected transistor $N_{S'1}$ turns on and the current through $N_{S'1}$ is $\pm Z_1 - B_1$ which corresponds to a value of $V_{S'1}$ that is inputted to next layer's scalar subthreshold MOSFET multiplier.

Silicon die area is saved by operating in current-mode and matching is improved by sharing same current mirrors (e.g., $P_1$, $P_{1'}$ and $P_2$, $P_{2'}$) to perform summation and subtraction functions by coupling plurality of respective multiplication products (e.g., plurality of $W_1 \cdot S_1$).

The embodiment of the circuit illustrated in FIG. 6 neither requires an intermediate Analog-to-Digital (ADC) to digitalize the analog $S'_1$ and $S'_2$ signals nor any intermediate activation memory to store the digitalized $S'_1$ and $S'_2$ codes and nor any intermediate activation Digital-to-Analog Converter (iDAC) to convert the digitalized $S'_1$ and $S'_2$ signals back to analog in order to pass them onto to the next layer.

As described earlier, the disclosed method of programming weight signals (i.e., w) and/or activation signals (i.e., s) and/or their combination can be uniformly distributed by being trained to a specific dynamic range at key summation node (e.g., Gaussian distribution with an average and a sigma) would provide a boundary around MAC signals (i.e., $\Sigma S_1 \cdot W_1$ or $\pm \Sigma S_1 \cdot W_1$) at corresponding summation nodes or through corresponding summation wires.

MAC summation signals (at node or through wires) with programmable swings can provide the benefit of lower power consumption and enhanced dynamic performance.

The simplified embodiment in FIG. 6 illustrates an embodiment that can be arranged in accordance with the method of 'programmable statistical distribution' of MAC signals.

FIG. 6 can be arranged with a plurality of multi-quadrant \VLSI signals that follow a programmable statistical distribution profile (e.g., Gaussian distribution with an average and a sigma), wherein the net MAC summation signal swing flowing onto transistor $N_{S'1}$ and $N_{S'2}$ can follow a programmable profile around the average value of multi-quadrant \VLSI signals gaussian distribution. Such an arrangement reduces power consumption and improves speed in light of a limited signal swing of multi-quadrant $W_1 \cdot S_1$ signals (e.g., signal swing following a ReLu profile with a statistically programmable upper limit, which can also be arranged with a current clamp circuit for a controllable maximum).

Please refer to this disclosure's introduction section titled DETAILED DESCRIPTION which outlines some of the benefits relevant to the embodiment disclosed in the section above.

Figure 7:
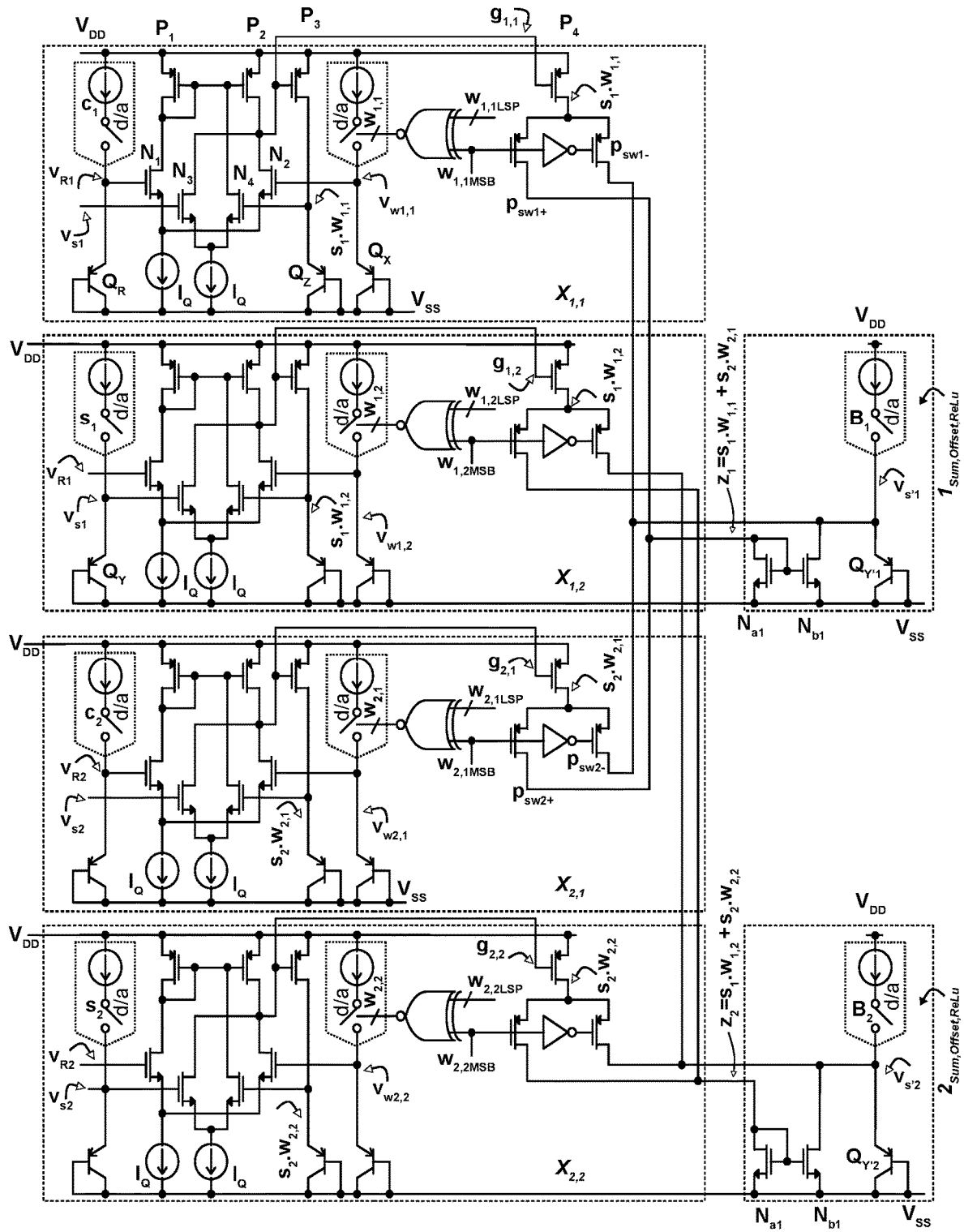
FIG. 7 is a circuit schematic illustrating a simplified embodiment of a multi-quadrant iMAC arranged with a plurality of scalar substrate vertical BJT-based multipliers that can be arranged in current-mode neural networks comprising of fully connected layers, and in accordance with scalar current-mode mixed-signal fully-connected neural-network method.

Section 7—Description of FIG. 7

FIG. 7 is a circuit schematic illustrating a simplified embodiment of a multi-quadrant iMAC comprising a plurality of scalar substrate vertical BJT-based multipliers that can be arranged in current-mode neural networks comprising of fully connected layers, and in accordance with scalar current-mode mixed-signal fully-connected neural-network method.

Also, free from intermediate Analog-to-Digital (ADC) and intermediate activation memory and intermediate activation Digital-to-Analog Converter (iDAC), the disclosed simplified embodiment of FIG. 7 can be arranged with SRAMs (for CIM) and programmable RBN that feed an array of activation and weight data converters whose outputs provide the input signals to a plurality of scalar current-input to current-output of scalar substrate vertical BJT-based multiplier. The multi-quadrant outputs of the array of the scalar substrate vertical BJT-based are supplied to a sum-offset-ReLu circuit before they are passed onto a subsequent neuron of a next layer.

In the simplified neural network embodiment illustrated in FIG. 7, please keep in mind that for clarity of descriptions and illustrations, number of activation and weight signals, number of scalar multipliers, and number of layers are kept to a few and small scales and proportions, which is not a limitation of the disclosed simplified embodiment and that substantially more and larger scales and proportions can be arranged.

The simplified neural network depiction of FIG. 7 is comprising of the following functional blocks: Activation DACs in the first layer (e.g., d/a: $S_1$, d/a: $S_2$), Weight DACs in the first layer (e.g., d/a: $W_{1,1}$, d/a: $W_{1,2}$ and d/a: $W_{2,1}$, d/a: $W_{2,2}$), Multiplication Reference DACs in the first layer (e.g., d/a: $C_1$, d/a: $C_2$), Bias-Offset DACs between the first and next layer (e.g., d/a: $B_1$, d/a: $B_2$), a plurality of scalar current-input to current-output (parasitic vertical) BJT multipliers ($X_{1,1}$, $X_{1,2}$, $X_{2,1}$, $X_{2,2}$) in the first layer wherein each comprising: $N_1$-$N_2$-$N_3$-$N_4$-$P_1$-$P_2$-$P_3$-$P_4$ and 2 quiescent current sources $I_Q$ & diode connected (parasitic vertical) BJTs $Q_R$-$Q_X$-$Q_Z$-$Q_Y$; A plurality of XNOR gates to receive the sign-magnitude weight codes; and circuits that perform the differential current summation of multi-quadrant MAC signals and bias-offset signals, and ReLu functions (e.g., $1_{SUM,OFFSET,ReLU}$, and $2_{SUM,OFFSET,ReLU}$).

Keep in mind that depending on the end-application requirements, the simplified neural network embodiment of FIG. 7 can be arranged with only one Multiplication Reference DAC (e.g., d/a: $C_1$) wherein for example the emitter voltage (e.g., VRi) of reference transistor (e.g., $Q_R$) can be shared amongst corresponding ports of plurality of scalar substrate vertical BIT-based multiplier, which saves silicon die area, lower current consumption, and improves matching between scalar multiplication products. Also, notice that activation/scalar signal (e.g., $V_{S1}$, $V_{S2}$, etc.,) can also be shared amongst corresponding ports of plurality of scalar substrate vertical BIT-based multiplier, which further saves silicon die area, lower current consumption, and improves matching between scalar multiplication products.

Also, keep in mind that for CIM like operations, SRAMs (not shown for clarity of illustration) that for example store the weight training, bias-offset, reference multiplication codes can be placed on the silicon die right next to Weight (e.g., d/a: $W_{1,1}$), Bias-Offset (e.g., da/a: $B_1$), and Multiplication Reference (e.g., d/a: DACs which can reduce dynamic power consumption associated with digital data communication cycles.

A $RBN_R$ (not shown for clarity of illustration) can be arranged to generates a 'bias voltage bus' which are plurality of reference voltage signals that for example can be shared amongst a plurality of reference network of a plurality of tiny Weight, Activation, Multiplication Reference, and Bias-Offset DACs.

Notice in the embodiment illustrated in FIG. 7 that for multi-quadrant operations, sign-magnitude weight codes are processed through XNOR and onto respective weight DACs. Also, the MSB sign-bit of a weight code is $Wi_{MSB}$ and the rest of the bits are $Wi_{LSP}$ as Leas-Significant-Portion of the corresponding weight code. Moreover, other digital word formats such as two's complement can be arranged for activation and weight digital signal words.

A code $S_1$, representing an activation signal (which is also a scalar signal), programs d/a: $S_1$ to generate a scalar current signal that is inputted to an emitter port of diode connected parasitic substrate transistor $Q_Y$, and generating a voltage signal $V_{S1}$ which is shared between multipliers $X_{1,1}$ and $X_{1,2}$.

A digital word $C_1$, representing a Multiplication Reference Signal, programs d/a: $C_1$ to generate a current signal that is inputted to an emitter port of a diode connected parasitic substrate transistor $Q_R$, and generating a voltage signal $V_{R1}$, which is also shared between multipliers $X_{1,1}$ and $X_{1,2}$.

A code $W_{1,1}$ representing a weight signal programs d/a: $W_{1,1}$, and in accordance with that is inputted to an emitter port of a diode connected parasitic substrate transistor $Q_X$, and generating a voltage signal $V_{w1,1}$.

A digital word $W_{1,2}$, representing a weight signal, and in accordance with XNOR operations, programs d/a: $W_{1,2}$ to generate a current signal in $X_{1,2}$ that generates $V_{w1,2}$.

Here is a brief description of how scalar multipliers $X_{1,1}$ and $X_{1,2}$ operate:

Let's denote $Veb_{Q_r} \approx v_{Q_r}$:$V_{R_1}$, $Veb_{Q_y} \approx v_{Q_y}$:$V_{S_1}$, $Veb_{Q_z} \approx v_{Q_z}$: $V_{S_1 \cdot w_{1,1}}$ and $Veb_{Q_x} \approx v_{Q_x}$: $V_{W_{1,1}}$.

Setting aside non-idealities in scalar multiplier $X_{1,1}$, the gain of a first amplifier's differential pairs $N_1$-$N_2$ through $P_1$-$P_2$-$P_3$ and second amplifier's differential pairs $N_3$-$N_4$ (also) through $P_1$-$P_2$-$P_3$ is substantially equal and G.

For scalar multiplier $X_{1,1}$, the gate voltage at node $g_{1,1}$ regulates transistor $P_3$'s current onto diode connected transistor $Q_Z$ so that the following equation holds:

$G \times \{(v_{Q_x} - v_{Q_r}) - (v_{Q_z} - v_{Q_y})\} \approx v_{Q_z} \Rightarrow (v_{Q_x} - V_{Q_r} + v_{Q_y}) \approx v_{Q_z}(1 + 1/G)$ and for $G >> 1 \Rightarrow v_{Q_x} - v_{Q_r} + v_{Q_y} \approx v_{Q_z}$. Thus, $(Veb_{Q_x} - Veb_{Q_r}) \approx (Veb_{Q_z} - Veb_{Q_y})$. Therefore, $$V_t \times \ln\left[\frac{I_{QX}}{I_{QR}}\right] \approx V_t \times \ln\left[\frac{I_{QZ}}{I_{QY}}\right].$$

For $I_{Q_r} = 1$, $I_{Q_z} \approx I_{Q_x} \times I_{Q_y}$. Substituting $I_{Q_z} \approx S_1 \cdot W_{1,1}$, $I_{Q_x} \approx W_{1,1}$, and $I_{Q_y} \approx S_1 \Rightarrow S_1 \cdot W_{1,1} \approx S_1 \times W_{1,1}$ Note that at the expense of extra circuitry and current consumption, independent multiplication reference signals can be programmed to perform batch normalization for plurality of MACs (e.g., programming $I_{Q_r}$ to different values in $I_{Q_z}$ ($I_{Q_x} \times I_{Q_y}$)/$I_{Q_R}$ for group of multipliers).

Next, the current signal representing $S_1 \cdot W_{1,1}$ is mirrored onto transistor $P_4$.

Bear in mind that voltage at node $g_{1,1}$ can be shared in plurality of current mirrors (with a single PMOS) to copy $S_1 \cdot W_{1,1}$ multiplication product signal onto other channels as required by an end-application.

The $W_{1,1MSB}$ controls the polarity of $S_1 \times W_{1,1}$ signal that is directed through either $P_{SW1+}$ or $P_{SW1-}$ transistors (current-switch) to generate multi-quadrant $\pm S_1 \times W_1$ signals that are 'multiplication product differential current signals' (e.g., $\pm S_1 \times W_{1,1}$) which are fed onto a current mirror comprising $N_{a1}$ and $N_{b1}$.

Similar equations and descriptions provided above also apply to scalar multiplier $X_{2,1} \Rightarrow S_2 \times W_{2,1} \approx S_2 \cdot W_{2,1}$. Here also, $W_{2,1MSB}$ controls the polarity of $S_2 \times W_{2,1}$ signal that is directed through either $P_{SW2+}$ or $P_{SW2-}$ current-switch to generate multi-quadrant $\pm S_2 \times W_{2,1}$ signal which are then coupled/summed with $\pm S_1 \times W_{1,1}$ (and fed onto the same current mirror comprising of $N_{a1}$ and $N_{b1}$) to generate $\pm Z_1$.

As a result, a differential multi-quadrant $\pm Z_1 = \pm S_1 \times W_{1,1} \pm S_2 \times W_{2,1}$ is applied across the current mirror comprising $N_{a1}$ and $N_{b1}$ whose outputs are summed with offset-bias current of d/a: $B_1$. The output port of $N_{a1}$ and $N_{b1}$ current mirror is also couple with a diode-connected substrate vertical PNP transistor $Q_{Y'1}$ transistor (of the next layers scalar multiplier) to facilitate ReLu operation, as part of an $1_{SUM,OFFSET,ReLu}$ functional block illustrated in the simplified embodiment of FIG. 7. Thus, a signal $S'_1 = \text{ReLu}\{\pm Z_1 + B_1\}$ is generated and here is how:

If the $\pm Z_1 > B_1$, then the diode connected $Q_{Y'1}$ transistor shuts off and its current signal trends towards zero. If the $\pm Z_1 < B_1$, then the diode connected $Q_{Y'1}$ transistor's current signal trend towards $\pm Z_1 + B_1$, which is then passed onto a diode connected transistor (e.g., $Q_{Y'1}$) of the next scalar multiplier in the next layer of neural network as an intermediate scalar/activation signal $S'_1 = \text{ReLu}\{\pm Z_1 + B_1\}$.

Similar equations and descriptions provided above also apply to the other scalar multipliers $X_{1,2} \Rightarrow S_1 \times W_{1,2} \approx S_1 \cdot W_{1,2}$, and $X_{2,2} \Rightarrow S_2 \times W_{2,2} \approx S_2 \cdot W_{2,2}$. Accordingly, $2_{SUM,OFFSET,ReLu}$ (functional block illustrated in the simplified embodiment of FIG. 7) generates another intermediate scalar/activation signal $S'_2 = \text{ReLu}\{\pm Z_2 \pm B_2\}$ wherein $Z_2 = \pm S_1 \times W_{1,2} \pm S_2 \times W_{2,2}$.

Notice that for performing a multi-quadrant scalar MAC operation, a plurality of $\pm S_1 \times W_1$ signals can share the same Add+ReLu functional block similar to what is depicted in the simplified embodiment of FIG. 7. Accordingly, the addition and subtraction functions (in current mode) for multi-quadrant operations as well as the offset-biasing, and ReLu functions can be performed with one Add+ReLu functional block which saves on silicon die area, and improves matching (in part because one current mirror (e.g., $N_a$ and $N_b$, etc.,) as well as corresponding intermediate activation transistors that are diode connected substrate vertical PNP transistors (e.g., $Q_{Y'1}$, $Q_{Y'2}$, etc.,) can be shared between plurality of $\pm S_1 \times W_1$ signals.

Please also note that intermediate activation signals (e.g., $V_{S'1}$, $V_{S'2}$, etc.) do not require being digitalized by an ADC and require no register/memory but instead an intermediate activation signals can be inputted as a scalar activation signal into a corresponding diode connected substrate vertical PNP transistors of a corresponding scalar multiplier in the next layer, which saves on silicon area, reduces power consumption and enhances signal processing time.

Also, the disclosed method of programming weight signals (i.e., w) and/or activation signals (i.e., s) and/or their combination can be uniformly distributed by being trained to a specific dynamic range at key summation node (e.g., Gaussian distribution with an average and a sigma) would provide a programmable boundary around MAC signals (i.e., $\Sigma S_1 \cdot W_1$ or $\pm \Sigma S_1 \cdot W_1$ or multi-quadrant $\pm S_1 \times W_1$ signals) at corresponding summation nodes or through corresponding summation wires. MAC summation signals (at node or through wires) with programmable swings can provide the benefit of lower power consumption and enhanced dynamic performance.

The simplified embodiment in FIG. 7 illustrates another embodiment that can be arranged in accordance with the method of 'programmable statistical distribution' of MAC signals.

FIG. 7 can also be arranged with a plurality of multi-quadrant $\pm S_1 \times W_1$ signals that follow a programmable statistical distribution profile (e.g., Gaussian distribution with an average and a sigma), wherein the net MAC summation signal swing flowing onto an intermediate activation (parasitic vertical) diode connected BJT can follow a programmable profile around the average value of $\pm S_1 \times W_1$ gaussian distribution. Such an arrangement can reduce power consumption and improves speed in light of a limited signal swing through diode connected BJT (e.g., signal swing following a ReLu profile with a statistically programmable upper limit, which can also be arranged with a current clamp circuit for a controllable maximum).

Please refer to this disclosure's introduction section titled DETAILED DESCRIPTION which outlines some of the benefits relevant to the embodiment disclosed in the section above.

Figure 8:
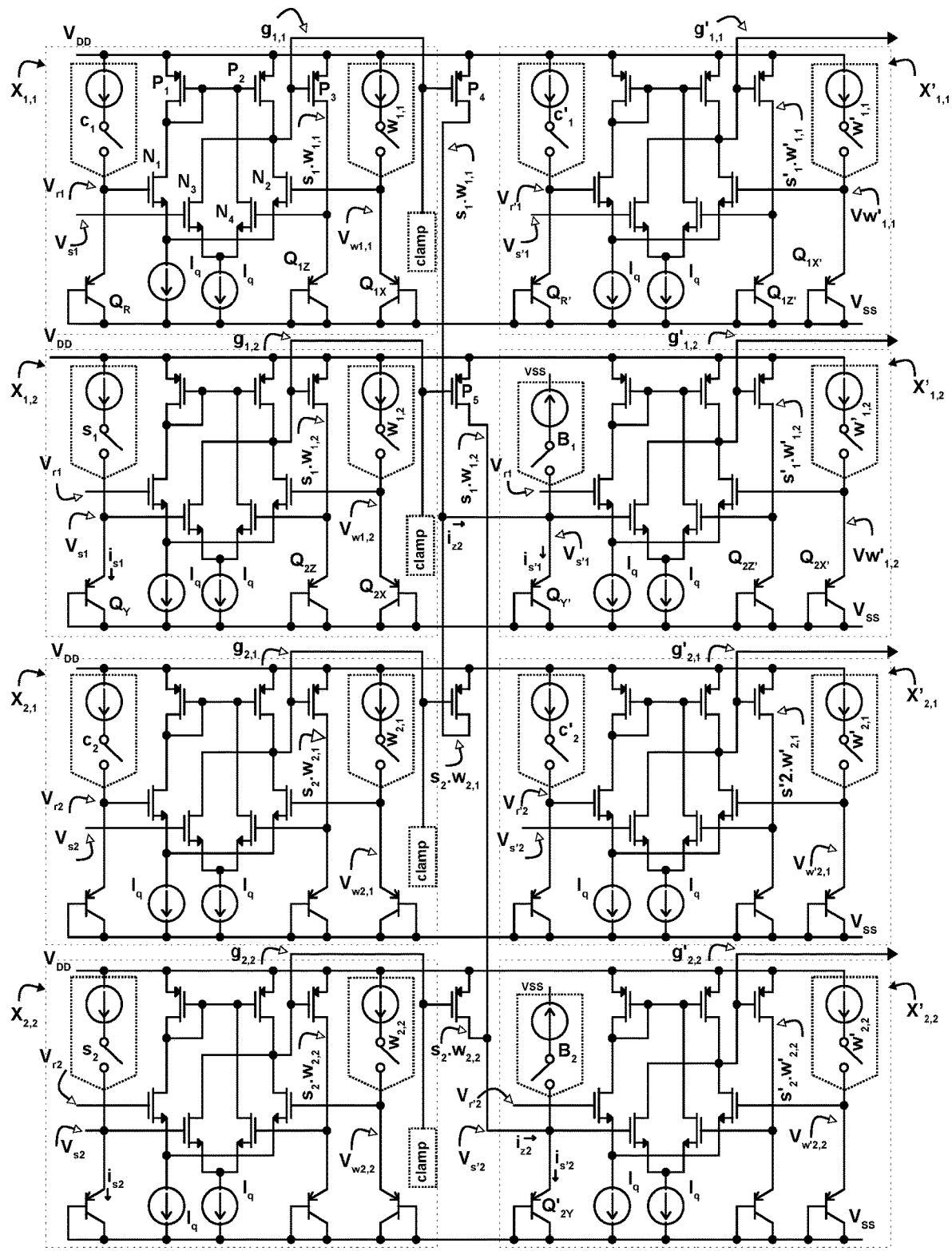
FIG. 8 is a circuit schematic illustrating a simplified embodiment of a current-mode neural network comprising of fully connected layers, and in accordance with scalar current-mode mixed-signal fully-connected neural-network method.

Section 8—Description of FIG. 8

FIG. 8 is a circuit schematic illustrating a simplified embodiment of a current-mode neural network comprising of fully connected layers, and in accordance with scalar current-mode mixed-signal fully-connected neural-network method.

Also, free from intermediate Analog-to-Digital (ADC) and intermediate activation memory and intermediate activation Digital-to-Analog Converter (iDAC), the disclosed simplified embodiment of FIG. 8 can be arranged with SRAMs (for CIM) and it can be programmable RBN that feed an array of activation and weight data converters whose output provide the input signals to a plurality of scalar current-input to current-output of substrate vertical BJT-based multiplier.

In the simplified neural network embodiment illustrated in FIG. 8, please keep in mind that for clarity of descriptions and illustrations, number of activation and weight signals, number of scalar multipliers, and number of layers are kept to a few and small scales and proportions, which is not a limitation of the disclosed simplified embodiment and that substantially more and larger scales and proportions can be arranged.

The simplified neural network depiction of FIG. 8 is comprising of a plurality of scalar current-input to current-output of substrate vertical BJT-based multipliers (e.g., $X_{1,1}$, $X_{1,2}$, $X_{2,1}$, $X_{2,2}$ in the first layer and $X'_{1,1}$, $X'_{1,2}$, $X'_{2,1}$, and $X'_{2,2}$, in the next layer). Each scalar multiplier is comprised of a differential difference amplifier (e.g., containing transistors $N_1$, $N_2$, $N_3$, $N_4$, $P_1$, $P_2$, $P_3$, a pair of quiescent current sources $I_Q$) and a Weight DAC (e.g., d/a: $W_{1,1}$). Each scalar multiplier is also comprised of independent diode connected substrate vertical BJTs (e.g., $Q_{1X}$ and $Q_{1Z}$). Moreover, each scalar multiplier shares a couple of diodes connected substrate vertical BJTs (e.g., $Q_{1Y}$ and $Q_{1R}$) as well as sharing an Activation DAC (e.g., d/a: $S_1$) and a Multiplication Reference DACs (e.g., d/a: $C_1$) between a plurality of scalar multipliers (e.g., two scalar multipliers channels in the case of simplified embodiment of FIG. 8). There is also a plurality of Bias-Offset DACs between the first and next layer (e.g., d/a: $B_1$, d/a: $B_2$). Here, multiplication product current mirrors (e.g., $P_4$, $P_5$) copy and sum respective multiplication product current signals (e.g., $Z_1 = S_1 \cdot W_{1,1} + S_2 \cdot W_{2,1}$) which are inputted to a next layer's intermediate diode connected substrate vertical BJTs, which can inherently perform a ReLu function.

Keep in mind that depending on the end-application requirements, the simplified neural network embodiment of FIG. 8 can be arranged with only one Multiplication Reference DAC (e.g., d/a: $C_1$) wherein for example the emitter voltage (e.g., $V_{R1}$) of reference diode connected vertical substrate BJT (e.g., $Q_R$) can be shared amongst corresponding ports of plurality of scalar substrate vertical BJT-based multipliers in the first and next layers, which saves silicon die area, lower current consumption, and improves matching between scalar multiplication products. Also, notice that activation signal (e.g., $V_{S1}$, $V_{S2}$, etc.,) can also be shared amongst corresponding ports of plurality of scalar substrate vertical BJT-based multiplier, which further saves silicon die area, lower current consumption, and improves matching between scalar multiplication products.

Furthermore, keep in mind that for CIM like operations, SRAMs (not shown for clarity of illustration) that for example store the weight training, bias-offset, reference multiplication codes can be placed on the silicon die right next to Weight (e.g., d/a: $w_{1,1}$), Bias-Offset (e.g., da/a: $B_1$), and Multiplication Reference (e.g., d/a: $C_1$) DACs which can reduce dynamic power consumption associated with digital data communication cycles.

Moreover, a $RBN_R$ (not shown for clarity of illustration) can be arranged, in the simplified embodiment illustrated in FIG. 8, to generates a 'bias voltage bus' which are plurality of reference voltage signals that for example can be shared amongst a plurality of reference network of a plurality of tiny Weight, Activation, Multiplication Reference, and Bias-Offset DACs.

A code $S_1$, representing an activation signal (which is also a scalar signal), programs d/a: $S_1$ to generate a scalar current signal that is inputted onto a diode connected parasitic substrate transistor $Q_Y$, and generating a voltage signal $V_{S1}$ which is shared between scalar multipliers $X_{1,1}$ and $X_{1,2}$.

A digital word $C_1$, representing a Multiplication Reference Signal, programs d/a: $C_1$ to generate a current signal that is inputted onto a diode connected parasitic substrate transistor $Q_R$, and generating a voltage signal $V_{R1}$, which is also shared between multipliers $X_{1,1}$ and $X_{1,2}$.

A code $W_{1,1}$ representing a weight signal programs d/a: $W_{1,1}$ is inputted onto a diode connected parasitic substrate transistor $Q_{1X}$ generating a voltage signal $V_{w1,1}$.

A digital word $W_{1,2}$, representing a weight signal programs d/a: $W_{1,2}$ to generate a current signal in $X_{1,2}$ that is fed onto a diode connected parasitic substrate transistor $Q_{2X}$ generating $V_{w1,2}$.

Similar to the description provided in the previous section, here is a brief description of how scalar multipliers $X_{1,1}$ and $X_{1,2}$ operate:

Let's denote $Veb_{Q_r} \approx V_{Q_r}$: $V_{R1}$, $Veb_{Q_y} \approx v_{Q_y}$: $V_{S_1}$, $Veb_{Q_z} \approx v_{Q_z}$: $V_{S_1 \cdot w_{1,1}}$ and $Veb_{Q_x} \approx v_{Q_x}$: $V_{w_{1,1}}$.

Setting aside non-idealities in scalar multiplier $X_{1,1}$, the gain through a first amplifier's differential transistor pairs $N_1$-$N_2$ through $P_1$-$P_2$-$P_3$ transistor and second amplifier's differential transistor pairs $N_3$-$N_4$ also through $P_1$-$P_2$-$P_3$ transistor is substantially equal and G.

For scalar multiplier $X_{1,1}$, the gate voltage at node $g_{1,1}$ regulates transistor $P_3$'s current onto diode connected transistor $Q_Z$ so that the following equation holds:

$G \times \{(v_{Q_x} - v_{Q_r}) - (v_{Q_z} - v_{Q_y})\} \approx v_{Q_z} \Rightarrow (v_{Q_x} - v_{Q_r} + v_{Q_y}) \approx v_{Q_z}(1 + 1/G)$ and for $G \gg 1 \Rightarrow v_{Q_x} - v_{Q_r} + v_{Q_y} \approx v_{Q_z}$. Thus, $(Veb_{Q_x} - Veb_{Q_r}) \approx (Veb_{Q_z} - Veb_{Q_y})$. Therefore, $$V_t \times \ln\left[\frac{I_{QX}}{I_{QR}}\right] \approx V_t \times \ln\left[\frac{I_{QZ}}{I_{QY}}\right].$$

for $I_{Q_r} = 1$, $I_{Q_z} \approx (I_{Q_x} \times I_{Q_y})$. Substituting $I_{Q_z} \approx S_1 \cdot W_{1,1}$, $I_{Q_x} \approx W_{1,1}$, and $I_{Q_y} \approx S_1 \Rightarrow S_1 \cdot W_{1,1} \approx S_1 \times W_{1,1}$.

Note that at the expense of extra circuitry and current consumption, independent multiplication reference signals can be programmed to perform batch normalization for plurality of MACs (e.g., programming $I_{Q_r}$ to different values in $I_{Q_z} \approx (I_{Q_x} \times I_{Q_y})/I_{Q_R}$ for group of multipliers).

Next, the current signal representing $S_1 \cdot W_{1,1}$ is mirrored onto transistor $P_4$.

Bear in mind that voltage at node $g_{1,1}$ can be shared in plurality of current mirrors (with a single PMOS) to copy $S_1 \cdot W_{1,1}$ multiplication product signal onto other scalar multiplier channels as required by an end-application.

Similar equations and descriptions provided above also apply to the other scalar multipliers such as $X_{2,1} \Rightarrow S_2 \times W_{2,1} \approx S_2 \cdot W_{2,1}$ signal that is mirrored and summed with $S_1 \cdot W_{1,1}$ to generate $Z_1$.

As a result, a summation signal $Z_1 = S_1 \times W_{1,1} + S_2 \times W_{2,1}$ is summed with offset-bias current of d/a: $B_1$, that is also couple with a diode-connected substrate vertical PNP transistor $Q_{Y'}$ transistor to facilitate ReLu operation. Thus, a signal $S'_1 = ReLu\{\pm Z_1 + B_1\}$ is generated and here is how:

When $Z_1 < B_1$ or when $I_{S'1} < 0$ then the diode connected $Q_{Y'}$ transistor shuts off and its current signal trends towards zero. If the $Z_1 > B_1$ or when $I_{S'1} > 0$ then the diode connected $Q_{Y'}$ transistor's current signal trend towards $Z_1 - B_1$ signal, which feeds a diode connected transistor (e.g., $Q_{Y'}$) in the next layer of neural network, representing the next intermediate activation/scalar signal $S'_1 = ReLu\{Z_1 - B_1\}$.

Similar equations and descriptions provided above also apply to the other scalar multipliers $X_{1,2} \Rightarrow S_1 \times W_{1,2} \approx S_1 \cdot W_{1,2}$, and $X_{2,2} \Rightarrow S_2 \times W_{2,2} \approx S_2 \cdot W_{2,2}$. Accordingly, $S'_2 = ReLu\{Z_2 - B_2\}$ signal is generated wherein $Z_2 = S_1 \times W_{1,2} + S_2 \times W_{2,2}$.

Please also note that intermediate activation signals (e.g., $V_{S'1}$, $V_{S'2}$, etc.) do not require being digitalized by an ADC and require no register/memory but instead intermediate activation signals can be inputted as a scalar activation signal into a corresponding diode connected substrate vertical PNP transistors of a corresponding scalar multiplier of the next layer, which saves on silicon area, reduces power consumption and enhances signal processing time.

Please refer to this disclosure's introduction section titled DETAILED DESCRIPTION which outlines some of the benefits relevant to the embodiment disclosed in the section above.

What is claimed:

1. A scalar current-mode mixed-signal fully-connected neural-network method in an integrated circuit, the method comprising:

operating an at least one of a plurality of scalar multipliers ($X_{P,Q}$), each having a weight-input port (W), an scalar activation-input port (S), a reference-input port (R), and a multiplication product-output port (Z), wherein a difference signal $V_S - V_R$ is the difference between an S port voltage signal ($V_S$) and an R port voltage signal ($V_R$) of each scalar multiplier, and the $V_S - V_R$ difference signal is substantially equal to a voltage signal difference between the Z port and the W port ($V_Z - V_W$) of each scalar multiplier, and wherein a multiplication product ($I_W \cdot I_S$) of current signals at the W port ($I_W$) and the S port ($I_S$) of each scalar multiplier is substantially equal to a multiplication product ($I_R \cdot I_Z$) of current signals at the R port ($I_R$) and the Z port ($I_Z$) of each scalar multiplier, and wherein in each scalar multiplier, ($V_S-V_R$) is substantially equal to ($V_Z-V_W$) and ($I_W \cdot I_S$) is substantially equal to ($I_R \cdot I_Z$):

performing scalar multiplication by a sharing circuit that generates at least one of (1) the difference signal $V_S-V_R$, and (2) the $V_S$ and the $V_R$, with a selected of the at least one of the plurality of scalar multipliers;

arranging a 1-1 multiplier ($X_{1,1}$) in a first layer of neural network (NN) comprising:
  supplying the W port of the $X_{1,1}$ multiplier with a $W_{1,1}$ input-signal;
  supplying the S port of the $X_{1,1}$ multiplier with a $S_1$ input-signal;
  supplying the R port of the $X_{1,1}$ multiplier with a $R_{1,1}$ input-signal;
  generating a $W_{1,1}\ S_1/R_{1,1}$ output-signal ($Z_{1,1}$) at the Z output port of the $X_{1,1}$ multiplier;

arranging a 1-2 multiplier ($X_{1,2}$) in the first layer of the NN comprising:
  supplying the W port of the $X_{1,2}$ multiplier with a $W_{1,2}$ input-signal;
  supplying the S port of the $X_{1,2}$ multiplier with a $S_1$ input-signal;
  supplying the R port of the $X_{1,2}$ multiplier with a $R_{1,2}$ input-signal;
  generating a $W_{1,2}\ S_1/R_{1,2}$ output-signal ($Z_{1,2}$) at the Z output port of the $X_{1,2}$ multiplier;

arranging a 2-1 multiplier ($X_{2,1}$) in the first layer of the NN comprising:
  supplying the W port of the $X_{2,1}$ multiplier with a $W_{2,1}$ input-signal;
  supplying the S port of the $X_{2,1}$ multiplier with a $S_2$ input-signal;
  supplying the R port of the $X_{2,1}$ multiplier with a $R_{2,1}$ input-signal;
  generating a $W_{2,1}\ S_2/R_{2,1}$ output-signal ($Z_{1,1}$) at the Z output port of the $X_{2,1}$ multiplier;

arranging a 2-2 multiplier ($X_{2,2}$) in the first layer of the NN comprising:
  supplying the W port of the $X_{2,2}$ multiplier with a $W_{2,2}$ input-signal;
  supplying the S port of the $X_{2,2}$ multiplier with a $S_2$ input-signal;
  supplying the R port of the $X_{2,2}$ multiplier with a $R_{2,2}$ input-signal;
  generating a $W_{2,2}\ S_2/R_{2,2}$ output-signal ($Z_{2,2}$) at the Z output port of the $X_{2,2}$ multiplier;

summing the $Z_{1,1}$ and the $Z_{2,1}$ signals to generate a $Z_1$ signal ($Z_{1,1}+Z_{2,1}$) in the first layer of the NN;

summing the $Z_{2,1}$ and the $Z_{2,2}$ signals to generate a $Z_2$ signal ($Z_{2,1}+Z_{2,2}$) in the first layer of the NN;

subtracting a 1 Bias-Offset signal ($B_1$) from the $Z_1$ signal to generate a $S'_1$ intermediate activation signal, in the first layer of the NN, that is substantially equal to $Z_1-B_1$; and subtracting a 2 Bias-Offset signal ($B_2$) from the $Z_2$ signal to generate a $S'_2$ intermediate activation signal, in the first layer of the NN, that is substantially equal to $Z_2-B_2$.

2. The scalar current-mode mixed-signal fully-connected neural-network method in an integrated circuit of claim 1, the method further comprising:

arranging a 1-1' multiplier ($X'_{1,1}$) in a second layer of NN comprising:
  supplying the W port of the $X'_{1,1}$ multiplier with a $W'_{1,1}$ input-signal;
  supplying the S port of the $X'_{1,1}$ multiplier with a $S'_1$ input-signal;
  supplying the R port of the $X'_{1,1}$ multiplier with a $R'_{1,1}$ input-signal;
  generating a $W'_{1,1}\ S'_1/R'_{1,1}$ output-signal ($Z'_{1,1}$) at the Z output port of the $X'_{1,1}$ multiplier;

arranging a 1-2' multiplier ($X'_{1,2}$) in the second layer of the NN comprising:
  supplying the W port of the $X'_{1,2}$ multiplier with a $W'_{1,2}$ input-signal;
  supplying the S port of the $X'_{1,2}$ multiplier with a $S'_1$ input-signal;
  supplying the R port of the $X'_{1,2}$ multiplier with a $R'_{1,2}$ input-signal;
  generating a $W'_{1,2}\ S'_1/R'_{1,2}$ output-signal ($Z'_{1,2}$) at the Z output port of the $X'_{1,2}$ multiplier;

arranging a 2-1' multiplier ($X'_{2,1}$) in the second layer of the NN comprising:
  supplying the W port of the $X'_{2,1}$ multiplier with a $W'_{2,1}$ input-signal;
  supplying the S port of the $X'_{2,1}$ multiplier with a $S'_2$ input-signal;
  supplying the R port of the $X'_{2,1}$ multiplier with a $R'_{2,1}$ input-signal;
  generating a $W'_{2,1} \times S'_2/R'_{2,1}$ output-signal ($Z'_{1,1}$) at the Z output port of the $X'_{2,1}$ multiplier;

arranging a 2-2' multiplier ($X'_{2,2}$) in the second layer of the NN comprising:
  supplying the W port of the $X'_{2,2}$ multiplier with a $W'_{2,2}$ input-signal;
  supplying the S port of the $X'_{2,2}$ multiplier with a $S'_2$ input-signal;
  supplying the R port of the $X'_{2,2}$ multiplier with a $R'_{2,2}$ input-signal;
  generating a $W'_{2,2}\ S'_2/R'_{2,2}$ output-signal ($Z'_{2,2}$) at the Z output port of the $X'_{2,2}$ multiplier;

summing the $Z'_{1,1}$ and the $Z'_{2,1}$ signals to generate a $Z'_1$ signal ($Z'_{1,1}+Z'_{2,1}$) in the second layer of the NN;

summing the $Z'_{2,1}$ and the $Z'_{2,2}$ signals to generate a $Z'_2$ signal ($Z'_{2,1}+Z'_{2,2}$) in the second layer of the NN;

subtracting a 1' Bias-Offset signal ($B'_1$) from the $Z'_1$ signal to generate a $S''_1$ intermediate activation signal, in the second layer of the NN, that is substantially equal to $Z'_1-B'_1$; and subtracting a 2' Bias-Offset signal ($B'_2$) from the $Z'_2$ signal to generate a $S''_2$ intermediate activation signal, in the second layer of the NN, that is substantially equal to $Z'_2-B'_2$.

3. The scalar current-mode mixed-signal fully-connected neural-network method in an integrated circuit of claim 2, the method further comprising:

supplying the R port of each multiplier in the second NN layer with at least one of a common reference input signal (R'), and individual reference input signals.

4. The scalar current-mode mixed-signal fully-connected neural-network method in an integrated circuit of claim 2, the method further comprising:

arranging each scalar multiplier in the second NN layer with at least one of (1) scalar substrate vertical BJT-based multipliers, (2) scalar subthreshold MOSFET-based multipliers, and (3) current-mode analog multipliers.

5. The scalar current-mode mixed-signal fully-connected neural-network method in an integrated circuit of claim 2, the method further comprising:

performing a batch normalization function in the second NN layer on the S″$_1$ intermediate activation signal to generate an S″$_{1N}$ normalized intermediate activation signal; and performing a batch normalization function in the second NN layer on the S″$_2$ intermediate activation signal to generate an S″$_{1N}$ normalized intermediate activation signal.

6. The scalar current-mode mixed-signal fully-connected neural-network method in an integrated circuit of claim 2, the method further comprising:

performing a ReLu function in the second NN layer on the S″$_1$ intermediate activation signal to generate an S″$_{1R}$ intermediate activation signal substantially equal to ReLu{Z′$_1$−B′$_1$}; and performing a ReLu function in the second NN layer on the S″$_2$ intermediate activation signal to generate an S″$_{2R}$ intermediate activation signal substantially equal to ReLu{Z′$_2$−B′$_2$}.

7. The scalar current-mode mixed-signal fully-connected neural-network method in an integrated circuit of claim 2, the method further comprising:

operating a plurality of Digital-to-Analog-Converters (DAC), each having a current-output signal (O) proportional to its reference input signal (r) and responsive to its digital input code (D);

supplying at least one W code (D$_W$) to at least one of the plurality of DACs (DAC$_W$), generating an at least one O signal (W$_O$);

supplying at least one W port of at least one scalar multiplier in the second NN layer with the at least one W$_O$ signal;

supplying at least one R code (D$_R$) to at least one other of the plurality of DACs (DACs), generating an at least one R signal (R$_O$);

supplying at least one R port of at least one other scalar multiplier in the second NN layer with the at least one R$_O$ signal; and receiving at least one of the D$_W$ and D$_R$ codes from at least one of a Latch array, a Static-Random-Access-Memory (SRAM) array, an Erasable-Programmable-Read-Only-Memory (EPROM) array, and an Electrically-Erasable-Programmable-Read-Only-Memory (EPROM) array.

8. The scalar current-mode mixed-signal fully-connected neural-network method in an integrated circuit of claim 1, the method further comprising:

supplying the R port of each multiplier in the first NN layer with at least one of a common reference input signal (R), and individual reference input signals.

9. The scalar current-mode mixed-signal fully-connected neural-network method in an integrated circuit of claim 1, the method further comprising:

arranging each scalar multiplier in the first NN layer with at least one of (1) scalar substrate vertical BJT-based multipliers, (2) scalar subthreshold MOSFET-based multipliers, and (3) current-mode analog multipliers.

10. The scalar current-mode mixed-signal fully-connected neural-network method in an integrated circuit of claim 1, the method further comprising:

performing a batch normalization function in the first NN layer on the S′$_1$ intermediate activation signal to generate an S′$_{1N}$ normalized intermediate activation signal; and performing a batch normalization function in the first NN layer on the S′$_2$ intermediate activation signal to generate an S′$_{1N}$ normalized intermediate activation signal.

11. The scalar current-mode mixed-signal fully-connected neural-network method in an integrated circuit of claim 1, the method further comprising:

performing a ReLu function in the first NN layer on the S′$_1$ intermediate activation signal to generate an S′$_{1R}$ intermediate activation signal substantially equal to ReLu{Z$_1$−B$_1$}; and performing a ReLu function in the first NN layer on the S′$_2$ intermediate activation signal to generate an S′$_{2R}$ intermediate activation signal substantially equal to ReLu{Z$_2$−B$_2$}.

12. The scalar current-mode mixed-signal fully-connected neural-network method in an integrated circuit of claim 11, the method further comprising:

supplying the S port of each of an X′$_{1,1}$ multiplier and an X′$_{1,2}$ multiplier in a second NN layer with the intermediate activation signal S′$_{1R}$; and supplying the S port of each of an X′$_{2,1}$ multiplier and an X′$_{2,2}$ multiplier in a second NN layer with the intermediate activation signal S′$_{2R}$.

13. The scalar current-mode mixed-signal fully-connected neural-network method in an integrated circuit of claim 1, the method further comprising:

operating a plurality of Digital-to-Analog-Converters (DAC), each having a current-output signal (O) proportional to its reference input signal (r) and responsive to its digital input code (D);

supplying at least one W code (D$_W$) to at least one of the plurality of DACs (DAC$_W$), generating an at least one O signal (W$_O$);

supplying at least one W port of at least one scalar multiplier in the first NN layer with the at least one W$_O$ signal;

supplying at least one R code (D$_R$) to at least one other of the plurality of DACs (DACs), generating an at least one R signal (R$_O$);

supplying at least one R port of at least one other scalar multiplier in the first NN layer with the at least one R$_O$ signal; and receiving at least one of the D$_W$ and D$_R$ codes from at least one of a Latch array, a Static-Random-Access-Memory (SRAM) array, an Erasable-Programmable-Read-Only-Memory (EPROM) array, and an Electrically-Erasable-Programmable-Read-Only-Memory (EPROM) array.

14. A scalar current-mode mixed-signal fully-connected neural-network method in an integrated circuit, the method comprising:

operating a plurality of Digital-to-Analog-Converters (DAC), each having a current-output signal (O) proportional to its reference input signal (r) and responsive to its digital input code (D);

operating a plurality of Reference Bias Networks (RBN), the output of each generating a plurality of reference voltage bus signals (VRi) responsive to binary weighted currents, each binary weighted current proportional to a respective RBN input current signal (I$_{RBN}$);

operating a plurality of Tiny DACs (tDAC), the current-output signal (OT) of each being proportional to a plurality of voltage reference signals (REF′) and responsive to its digital input code (DT);

supplying a S$_1$ activation input code (D$_{S1}$) to a DAC$_{S1}$ to generate a O$_{S1}$ output signal in a first neural network (NN) layer, wherein the O$_{S1}$ signal is substantially the same as the I$_{RBN}$ of a R$_{BNS1}$, and generating a plurality of VRi$_{S1}$ reference voltage signals;

supplying a $W_{1,1}$ digital input code to a $tDAC_{1,1}$ in the first NN layer, wherein the plurality of $VRi_{S1}$ reference voltage signals is substantially the same as the $REF_i$ of the $tDAC_{1,1}$, and generating a $Z_{1,1}=S_1 \times W_{1,1} \times 1/r$ scalar multiplication product output signal;

supplying a $W_{1,2}$ digital input code to a $tDAC_{1,2}$ in the first NN layer, wherein the plurality of $VRi_{S1}$ reference voltage signals is substantially the same as the $REF_i$ of the $tDAC_{1,2}$, and generating a $Z_{1,2}=S_1 \times W_{1,2} \times 1/r$ scalar multiplication product output signal;

supplying a $S_2$ activation input code ($D_{S2}$) to a $DAC_{S2}$ to generate a $O_{S2}$ output signal in the first NN layer, wherein the $O_{S2}$ signal is substantially the same as the $I_{RBN}$ of a $RBN_{S2}$, and generating a plurality of $VRi_{S2}$ reference voltage signals;

supplying a $W_{2,1}$ digital input code to a $tDAC_{2,1}$ in the first NN layer, wherein the plurality of $VRi_{S2}$ reference voltage signals is substantially the same as the $REF_i$ of the $tDAC_{2,1}$, and generating a $Z_{2,1}=S_2 \times W_{2,1} \times 1/r$ scalar multiplication product output signal;

supplying a $W_{2,2}$ digital input code to a $tDAC_{2,2}$ in the first NN layer, wherein the plurality of $VRi_{S2}$ reference voltage signals is substantially the same as the $REF_i$ of the $tDAC_{2,2}$, and generating a $Z_{2,2}=S_2 \times W_{2,2} \times 1/r$ scalar multiplication product output signal;

summing the $Z_{1,1}$ and the $Z_{2,1}$ signals to generate a $Z_1$ signal ($Z_{1,1}+Z_{2,1}$) in the first layer of the NN;

summing the $Z_{2,1}$ and the $Z_{2,2}$ signals to generate a $Z_2$ signal ($Z_{2,1}+Z_{2,2}$) in the first layer of the NN;

subtracting a 1 Bias-Offset signal ($B_1$) from the $Z_1$ signal to generate a $S'_1$ intermediate activation signal, in the first layer of the NN, that is substantially equal to $Z_1-B_1$; and subtracting a 2 Bias-Offset signal ($B_2$) from the $Z_2$ signal to generate a $S'_2$ intermediate activation signal, in the first layer of the NN, that is substantially equal to $Z_2-B_2$.

15. The scalar current-mode mixed-signal fully-connected neural-network method in an integrated circuit of claim 14, the method further comprising:

supplying a $S'_1$ activation input code ($D_{S'1}$) to a $DAC_{S'1}$ to generate an $O_{S'1}$ output signal in a second neural network (NN) layer, wherein the $O_{S'1}$ signal is substantially the same as the $I_{RBN}$ of a $RBN_{S'1}$, and generating a plurality of $VRi_{S'1}$ reference voltage signals;

supplying a $W'_{1,1}$ digital input code to a $tDAC'_{1,1}$ in the second NN layer, wherein the plurality of $VRi_{S'1}$ reference voltage signals is substantially the same as the $REF_i$ of the $tDAC'_{1,2}$, and generating a $Z'_{1,1}=S'_1 \times W'_{1,1} \times 1/r$ scalar multiplication product output signal;

supplying a $W'1,2$ digital input code to a $tDAC'_{1,2}$ in the second NN layer, wherein the plurality of $VRi_{S'1}$ reference voltage signals is substantially the same as the $REF_i$ of the $tDAC'_{1,2}$, and generating a $Z'_{1,2}=S'_1 \times W'_{1,2} \times 1/r$ scalar multiplication product output signal;

supplying a $S'_2$ activation input code ($D_{S'2}$) to a $DAC_{S'2}$ to generate an $O_{S'2}$ output signal in the second NN layer, wherein the $O_{S'2}$ signal is substantially the same as the $I_{RBN}$ of a $RBN_{S'2}$, and generating a plurality of $VRi_{S'2}$ reference voltage signals;

supplying a $W'2,1$ digital input code to a $tDAC'_{2,1}$ in the second NN layer, wherein the plurality of $VRi_{S'2}$ reference voltage signals is substantially the same as the $REF_i$ of the $tDAC'_{2,1}$, and generating a $Z'_{2,1}=S'_2 \times W'_{2,1} \times 1/r$ scalar multiplication product output signal;

supplying a $W'2,2$ digital input code to a $tDAC'_{2,2}$ in the second NN layer, wherein the plurality of $VRi_{S'2}$ reference voltage signals is substantially the same as the $REF_i$ of the $tDAC'_{2,2}$, and generating a $Z'_{2,2}=S'_2 \times W'_{2,2} \times 1/r$ scalar multiplication product output signal;

summing the $Z'_{1,1}$ and the $Z'_{2,1}$ signals to generate a $Z'_1$ signal ($Z'_{1,1}+Z'_{2,1}$) in the first layer of the NN;

summing the $Z'_{2,1}$ and the $Z'_{2,2}$ signals to generate a $Z'_2$ signal ($Z'_{2,1}+Z'_{2,2}$) in the first layer of the NN;

subtracting a 1' Bias-Offset signal ($B'_1$) from the $Z'_1$ signal to generate a $S''_1$ intermediate activation signal, in the first layer of the NN, that is substantially equal to $Z'_1-B'_1$; and subtracting a 2' Bias-Offset signal ($B'_2$) from the $Z'_2$ signal to generate a $S''_2$ intermediate activation signal, in the first layer of the NN, that is substantially equal to $Z'_2-B'_2$.

16. The scalar current-mode mixed-signal fully-connected neural-network method in an integrated circuit of claim 14, the method further comprising:

performing a ReLu function on the $S'_1$ signal to generate an $S'_{1R}$ intermediate activation signal substantially equal to $ReLu\{Z_1-B_1\}$; and performing a ReLu function on the $S'_2$ signal to generate an $S'_{2R}$ intermediate activation signal substantially equal to $ReLu\{Z_2-B_2\}$.

17. The scalar current-mode mixed-signal fully-connected neural-network method in an integrated circuit of claim 16, the method further comprising:

wherein the intermediate activation signal $S'_{1R}$ is substantially the same as the $I_{RBN}$ of a $RBN_{S'1}$; and wherein the intermediate activation signal $S'_{2R}$ is substantially the same as the $I_{RBN}$ of a $RBN_{S'2}$.

18. The scalar current-mode mixed-signal fully-connected neural-network method in an integrated circuit of claim 14, the method further comprising:

performing a batch normalization function on the $S'_1$ signal to generate an $S'_{1N}$ normalized intermediate activation signal; and performing a batch normalization function on the $S'_2$ signal to generate an $S'_{2N}$ normalized intermediate activation signal.

19. The scalar current-mode mixed-signal fully-connected neural-network method in an integrated circuit of claim 18, the method further comprising:

wherein the normalized intermediate activation signal $S'_{1N}$ is substantially the same as the $I_{RBN}$ of a $RBN_{S'1}$; and wherein the normalized intermediate activation signal $S'_{2N}$ is substantially the same as the $I_{RBN}$ of a $RBN_{S'2}$.

* * * * *